(12) United States Patent
Taylor

(10) Patent No.: US 10,480,730 B1
(45) Date of Patent: Nov. 19, 2019

(54) SUSTAINABLE LIGHT ENERGY GENERATION SYSTEM APPARATUS

(71) Applicant: Donald Warren Taylor, Fredericksburg, TX (US)

(72) Inventor: Donald Warren Taylor, Fredericksburg, TX (US)

(*) Notice: Subject to any disclaimer, the term of this patent is extended or adjusted under 35 U.S.C. 154(b) by 163 days.

(21) Appl. No.: 15/133,017

(22) Filed: Apr. 19, 2016

(51) Int. Cl.

| | | |
|---|---|---|
| H01L 31/05 | (2014.01) |
| F21S 9/03 | (2006.01) |
| H01L 31/0216 | (2014.01) |
| H02S 40/38 | (2014.01) |
| F21V 1/04 | (2006.01) |
| F21V 7/00 | (2006.01) |
| F21V 31/00 | (2006.01) |
| F21V 23/00 | (2015.01) |
| F21V 15/01 | (2006.01) |
| H02S 40/42 | (2014.01) |
| H01L 31/052 | (2014.01) |
| F21Y 115/10 | (2016.01) |

(52) U.S. Cl.
CPC .............. *F21S 9/032* (2013.01); *F21V 1/04* (2013.01); *F21V 7/00* (2013.01); *F21V 15/01* (2013.01); *F21V 23/003* (2013.01); *F21V 31/00* (2013.01); *H01L 31/02168* (2013.01); *H01L 31/05* (2013.01); *H01L 31/052* (2013.01); *H02S 40/38* (2014.12); *H02S 40/42* (2014.12); *F21Y 2115/10* (2016.08)

(58) Field of Classification Search
CPC .............................. H01L 31/052; H02S 40/42
See application file for complete search history.

(56) References Cited

U.S. PATENT DOCUMENTS

| | | | |
|---|---|---|---|
| 8,898,959 B2* | 12/2014 | Montefusco | F21V 1/14 362/153 |
| 9,410,693 B2* | 8/2016 | Cohen | F21V 33/0028 |
| 2006/0109647 A1* | 5/2006 | Liu | F21S 9/037 362/183 |
| 2012/0281393 A1* | 11/2012 | Allsop | F21S 9/037 362/183 |
| 2013/0070446 A1* | 3/2013 | Chen | F21L 4/02 362/183 |

FOREIGN PATENT DOCUMENTS

DE 10336543 A1 * 3/2005 .............. F21S 8/08

* cited by examiner

*Primary Examiner* — Charlie Y Peng

(57) ABSTRACT

A sustainable solar system device monitors watt production, consumption and deterioration of the components within a plurality of configured by designed solar panels, a solar light fixture and a solar lamp shade models configured within a plurality of solar cells and/or the plurality of solar-cell modules. The sustainable light system generates watt power manipulating by design the light spectrum rays to subsequent chambered layers, control gates power distribution to internal and external devices, managed by a smart solar system controller complex determining end of life cycle factors, efficiency levels and generate system analytics.

11 Claims, 11 Drawing Sheets

Layered Inter-Connected Cluster Matrix Array
Chamber Configuration for Fixed Panels 17 Outer Surface Panel Coated with Cooling Agent
15 Bottom Mounting Surface of Panel
13 Air or Liquid Cooling Chamber
11 Subsequent IC Photovoltaic Cluster Matrix Array Chamber
9 Air or Liquid Cooling Chamber
7A Secondary IC Photovoltaic Cluster Matrix Array Chamber
7 Secondary IC Photovoltaic Cluster Matrix Array Chamber
5 Air or Liquid Mater Cooling Chamber
3A Primary IC Photovoltaic Cluster Matrix Array Chamber Area
3 Primary IC Photovoltaic Cluster Matrix Array Chamber Area
1 Outer Surface Area of Photovoltaic Panel

Cluster Matrix Array

Zolar Vocal Point

Inter-Connected Cluster Matrix Array Chamber Configuration for Lamp Shades

9     *Inner Inside Light-Emitting Device Area*

8 ............................................................................................

7     *Inner Photovoltaic Cluster Matrix Array Chamber Area*

6 ............................................................................................

5     Air Chamber for heat transfer

4 ............................................................................................

3     *Outer Photovoltaic Cluster Matrix Array Chamber Area*

2 ............................................................................................

1     *Outer edge of Lamp Shade*

Figure 5

Layered Inter-Connected Cluster Matrix Array Chamber Configuration for Fixed Panels 16
17 Outer Surface Panel Coated with Cooling Agent 15 Bottom Mounting Surface of Panel

14

13 Air or Liquid Cooling Chamber

12

11 *Subsequent IC Photovoltaic Cluster Matrix Array Chamber*

10

9 Air or Liquid Cooling Chamber 8
7A *Secondary IC Photovoltaic Cluster Matrix Array Chamber*

7 *Secondary IC Photovoltaic Cluster Matrix Array Chamber*
6

5 Air or Liquid Mater Cooling Chamber 4
3A *Primary IC Photovoltaic Cluster Matrix Array Chamber Area*

3 *Primary IC Photovoltaic Cluster Matrix Array Chamber Area*
2

1 *Outer Surface Area of Photovoltaic Panel*

Figure 6

Interconnected Layered Cluster Matrix Array
Chamber Flat Panel Configuration

Zolar Vocal Point

Various Configured Light-Emitting Ziodes

SUSTAINABLE LIGHT ENERGY GENERATION SYSTEM APPARATUS

BACKGROUND OF THE INVENTION

Field of the Invention

The present apparatus relates to a zoned photo-electric and zoned photodiode, hereafter referred to: photo-zolectric/photoziode lamp shades and light fixtures, more particularly a plurality of chambered layered inter-connected clustered matrix array light-emitting diodes hereafter called zoned diodes (Ziodes) configured as a light fixture in a coordinated orientations with one or more photo-zolectric solar-cells hereafter called Zoned Solar-Cells (zolar-cells or zolar-cell modules) managing light energy generation conversion.

Authorization Pursuant to 37 C.F.R. § 1.171 (d)

Portions of the disclosure of this patent document contains material which is subject to copyright and trademark protection. The copyright owner has no objection to the facsimile reproduction by anyone of the patent document or the patent disclosure, as it appears in the Patent and Trademark Office patent file or records, but otherwise reserves all copyrights whatsoever.

Discussion of the Background

Currently, as the increasing documented facts becomes self evident, conventional abundant energy resources of oil and gas are nearing exhausted amount levels within a few decades or so.

Thus, therein lies the ever increasing necessity for sustainable alternative energy sources for interior and exterior lighting from relative photo-zolectric/photoziode light energy generation conversion system apparatus; wherein increasing production of direct electrical current powering electrical lighting or electrical equipment. In particular, there is a substantial need for wall, ceiling or table top light fixture or lamp shades, fixed ceiling canister styled light fixtures, flush or recessed ceiling mounted photo-zolectric/photoziode light fixture system that sustains self-power.

Furthermore, within the past few decades nano circuitry technology has evolved and will much further, most smart devices built function on direct current, televisions and household items shall follow, increasing the need for self sustainable light transmission energy generation.

Hence, the photo-zolectric apparatuses optical loss may be reduced, wherein the inverse relationship of the passivation from constructional elements of a thin film for the production of direct current, effects the increase of the transmission of light energy absorption along with decreasing the overall heat loss coefficient. As a result, electromagnetic radiation collected from photo-zolectric solar-panels, hereinafter called zolar-panels (zPanels) the efficiency conversion factor comprises a plurality of three or more solar-cells and solar-cell modules each positioned in a determined or specific zone area or field within an array, where a cluster of arrays comprise three or more arrays within a quadrant; wherein zolar panels comprise at least four quadrants; wherein each quadrant is configured with at least four quadrant sections; and each quadrant sections are divided into additional quadrant sections disposed within and hereafter referenced as a plurality of zolar-cells or zolar-cell modules that are inter-connected within each array, and may be better suited than that of traditional solar cell and solar panel system configurations currently in use on solar panels Meantime, natural or artificial light transmission penetrates a plurality of multiple layered chambered surfaces an their configured substrate materials within, managed band wave lengths long or short is capable of generating more light energy power inside each of the substrate layers, collecting larger amounts of solar energy hereinafter called zolar energy, since the heat reduction from a plurality of cooling chambers, subsequent chambered layers configured as a plurality of sizes and shapes of each of the zolar-cells or zolar-cell modules for both the cell itself and the surface material shape the zolar-cells or zolar-cell modules are formed on or attached thereto, increases light energy power generation exponentially when combined with principles of transmission absorption reflectance and refraction properties increasing watt generation.

With the advancement in thin film solar cells, the zolar-cells or zolar-cell modules can be arranged in dissimilar configurations within a plurality of arrangements of particular matrix surface area; wherein the surface area of a solar film, hereafter called zolar-film (ZF) is transparent between the plurality zolar-cells or zolar-cell modules and arrays within chambered layers that are comprised of a plurality synthetic, organic, plant composites, or combinations thereof including hemp, or of additional materials not listed; wherein light-emitting devices, hereinafter are called Light-Emitting Ziodes (LEZ-light fixture); wherein the LEZ-light fixture comprise a plurality of LEZ's that are inter-connected formed on, mounted or attached to a frame structure, where each LEZ arranged position is in unison with one or more zolar-cells or zolar-cell modules on lamp shades, hereinafter called: zLamp-Shades, zLamps or Zolar-Light fixtures (ZLF) systems; wherein one or more cooling chambers are comprised within a liquid or gas, or of additional matter not listed between, each buffered honey combed proportional configuration on the zolar-film between chamber layers attached thereto a plurality of clustered arrays within one or more quadrants comprise a matrix field or area, including subsequent layered matrix's of at least two or more clustered zolar arrangements above, below or around the primary chamber frame including inside surface areas of the housing or structure comprised of a plurality of the zolar-cells or zolar-cell modules modules, therein controlling light passage to subsequent sub-chambers and decreasing the heat factor at each chambers entrance level.

Industry conclusions currently agreed-upon relating to performance PV inefficiency, the atoms associated with radiant light energy placed upon current configured systems and their approaching loss ratio increases by 0.5% for every 1 degree Celsius or greater depending on geographical location deployed, age of solar panel system or designed features. Wherein atoms themselves collide at the surface area collection point and being absorbed within the solar cell configurations. The current associated collisions, such heat increase declines in proportional manner with subsequent sub-chambers configured below primary collection layered chamber increasing zolar absorption rates.

Wherein LEZ-light fixtures transmit controlled light rays are manipulated from there designed positions facilitating a plurality of natural an artificial light rays {also known as Zolar Rays (ZR)} directionally controlled towards a predetermined clustered of one or more Zolar Vocal Points (ZVP) and a plurality of Subsequent Level Matrix Portals (SLM), not only cooling the atoms as they continue onward in their direction as they enter a zPanel, zLamp-fixture, zLamp-shades or zLamp zolar system passing through primary layer, beyond one or more cooling chambers further reduces heat load as subsequent collection points on the surface of a plurality of sub-chambers below primary chambers substrate interface within configured chambers collect remaining natural an artificial light rays.

Hereinafter, the following reference to LICCMA short for: Layered Inter-Connected Cluster Matrix Array system apparatus, a plurality of arranged zolar-cells or zolar-cell modules are inter-connected arranged with a coordinated plurality of zolar-cells or zolar-cell modules on subsequent sub-chambered layers generating direct electrical current and further in linked communication with a zoned solar system controller, hereinafter referenced as a Zolar-System Controller (ZSC); wherein the phrase or term: photo-zolectric/photoziode refers to a 'light structure apparatus' comprised of a Zolar lamp shade, hereinafter referred to as: zLamp-shade (ZLS), a fixed or mobile light fixture further known as Zolar-Light fixtures (ZLF) or zLamps (zolar lamps) built or formed in the formation of a solar panel of a plurality of configurations including on zPanels, fixed or mobile light fixture panel built or formed of plurality of shapes and sizes, e.g. flat, round as a canister ceiling light, including street lights and a plurality of shaped-designed zolar light devices for interior or a exterior lighting device, here referred to as: zLamps; wherein the term 'Ziodes' is a semiconductor device with at least two terminals and a plurality of Ziode devices are built or formed with additional terminals, at least one terminal may or may not pulsate and may be of a plurality of colors within the light transmission spectrum to produce artificial light energy generation, and at least one terminal communicating with ZSC; wherein powering a plurality of LEZ (light-emitting ziode) devices configured on a LEZ-Light fixture allows the flow of direct current for the purpose of to illuminate methodically configured light patterns projected in the directions of an object illuminating area or controlled beams used to decorate objects or projecting at least one image, or both to decorate objects and projecting at least one image; further to transmit light-boosted bands of artificial light in a precise direction towards at least one zolar-cell or zolar-cell module within at least one array, an arrangement of such elements in a particular form of divergent configurations of different shapes and size cells with calculated spatial distance between constructing a 'photo-zolectric' device that may also operate in photoconductive mode, mounted to a base unit structure and optionally powered by alternating electricity, within or attached to a 'fixed or mobile light fixtures' a Zolar-Light fixture or zLamp-Shades. The plurality of the plurality of zolar-cell or zolar-cell modules are built or formed of in a plurality of configured variations, or of additional configurations not listed; wherein each Zolar-Light fixture device is either hung, mounted on a wall, ground or ceilings orientated on flat, curved or angular shaped-designed solar panels, hereafter called zoned solar panels zPanels or zLamps-Shades of are built or formed of a plurality of materials of different types, sizes and shapes from diverse elements, or of additional material or substances not listed; wherein such light structure apparatus is are built or formed for indoor or outdoor usage, or of additional uses not listed. Further the expression 'zolar arrangement' defines the configured orientation between at least one zolar-cell or zolar-cell module dedicated in a relational concern with at least one proportionally configured artificial light-emitting bulb devices or a plurality of semiconductor Ziodes (LEZ) configure on as a LEZ-light fixture and with inbound natural light rays. Wherein figuratively speaking, fixed light structures either wall or ceiling mounted built or formed purposely for inside or outside exposed to weather elements; wherein associated configured array of LEZ's attached to a configured base unit above or below at least on zolar-cell; wherein at least one LEZ is able to be pointed or in the case of Zolar-Light fixtures and zLamp-shades a rotational lock-in LEZ indicator, displaying the indication of aligned direction of the LEZ-light fixture towards, or in unison with a plurality of configured zolar-cell and zolar-cell module arranged in at least one array above or below the primary substrate layer within at least one zoned matrix in a similar configured field arrangement on either side or only underneath a configured LEZ light fixture is positioned beneath a transparent or translucent cover or a combination thereof; wherein cover is configured to transmit light ray images from a configuration of a plurality LEZ's as a unit device or just illuminate surrounding area or simultaneously illuminate and project a image or light patterns. The term 'photo-zolectric' (PZ) relates to the production of direct electrical power generation from layered zolar-cells or zolar-cell modules (ZC) converting light rays (bands) into direct electrical power, in differing shape formations of one or more ZC's and the conforming surface the plurality of zolar-cell or zolar-cell module are attached thereto; producing sustainable self-power at the junction of one or more configured compartmentalized substrate layers exposed to solar radiation or artificial light-emitting zolar rays (manipulated bands of light rays), or both solar radiation and artificial light rays from plurality of configured ziodes or LEZ-light fixtures that transmits artificial light in a coordinated configured balance between or with one or more zolar-cells or zolar-cell modules. The term 'zolar-film' consists of a formational flexible film, the zolar-cell film of nano thin matter preferably, components comprised of a transparent non-reflective matter, attached to a light structure apparatus, comprising at least one nano zolar-cell or zolar-cell module inter-connected with at least one zoned matrix comprised of at least one cluster of three or more arrays of zolar-cells or solar-cell modules, in communication with a ZSC.

DESCRIPTION OF THE INVENTION

Embodiments of the present apparatus generally relate to interconnected chambered layered photo-zolectric/photoziode clustered matrix array configured light-emitting energy collection system apparatus; for lamp shades, light fixtures and panels are built or formed in a plurality of configurations and fixed light structure apparatuses, including panels of a plurality of sized configurations. Particularly, the apparatus relates to a method in the manufacture of managed chambered photo-zolectric layered clustered zoned matrix array, securely attached on inner side or on bottom of inner and outer chamber surfaces below a non-reflective zolar-film or film for zLamp-Shades and below or above LEZ-light fixture or zLamp devices housing structure; each securely attached to a mounting surface on the wall, ceiling or table top light structure apparatus, that may or may not be equipped with a lamp shade, for the operation of sustainable direct electrical power, including zolar panels (zPanels) of a plurality of zolar arrangements.

More specifically, comprising inter-connected calculated dimensional positioned group of one or more light-emitting device(s), e.g. LEZ, configured in correlation with at least one clustered matrix array of one or more photo-zolectric/photoziode zolar-cells or zolar-cell modules in matched configurations on underside of primary levels outer edge and in configured refractive angular position with one or more zolar-cells or zolar-cell modules on outer side of subsequent chamber surface, followed by additional layers of similar constructional composites or from plant synthetics and hemp synthetic composites, or of additional materials or substance not listed. Maximizes light-emitting energy efficiency, directed towards outer (primary) and inner chamber surface areas on lamp shades and underside of a plurality of ceiling or wall fixed light fixture containers, generating direct electrical power from at least one LEZ-light fixture or from a plurality of LED or LEZ-light emitting devices in simultaneous performance.

Such Light Energy Generation, zolar arrangement substantially decrease light energy loss, if not eliminating virtually all lost light-emitting rays necessary to sustain power for LEZ-light fixture and provide capacity power to charge external items, from the collection of zolar electromagnetic radiation on outer surfaces edge on either outer or inner subsequent surface chamber areas, near the visible range and artificial illumination, above and around a fixed light structure apparatus from surrounding direct LEZ-light fixture attached thereto within frame structure; and from either sun or surrounding artificial light directed towards chambers outer edge or placed near to edge.

The innovative zolar arrangement allows the construction of interconnected clustered photo-zolectric matrix array layered system. Whereby the environment on zLamp-shades, ceiling lights flush or recessed configuration, establishes an era of historical dimensions. More specifically the zolar system apparatus, comprises at least on group of calculated positioned photo-zolectric/photoziode with dimensional layers of zolar-cells or zolar-cell modules maximizing photo-zolectric light-emitting energy efficiency, directed towards on subsequent layers of one or more arrays, clusters, or clusters of a plurality of arrays configured within a quadrant of the photo-zolectric/photoziode zolar-cells or zolar-cell modules within, on underside of inner surface area or outer inner surface area the plurality of zLamp-shades, zLamp-fixtures or zLamps fixed to a ceiling, wall or hung, or zpanels from light-emitting semiconductor ziodes or arranged light-emitting device(s); and light energy generation on outer surface edge from surrounding natural light; either sun or artificial light directed towards or placed near to the outer edge surfaces. The entire zolar arrangement substantially decrease pointed energy loss, collecting zolar electromagnetic radiation near the visible range and artificial light, concentrated system has the advantage to capture nearly all light-emitting rays from natural or artificial sources, maximizing associated heat dissipation on each chambered layer system increasing energy generation efficiency.

Photo-zolectric energy collector zolar-cells or zolar-cell modules, including the plurality of at least one matrix array zolar arrangement in association with convex or flat curved mirrors, orientated around upper and lower leading lamp shade edges or areas within the same surface area, intensifying drift light-emitting rays directed towards certain photo-zolectric/photoziode collectors within, each having its own managed associated respective matrix interconnected array under the inner and outer edge or beneath non-reflective surface a fixed light structure apparatus. Each photo-zolectric/photoziode zolar-cell or zolar cell modules arrangement is dispersed in different directions or of different patterns based on predetermined calculated formations on inside of inner and outer surface areas for lamp shades and fixed panel types of its respective curved or flat bottom or mounting surface side area. Wherein each photo-zolectric/photoziode device, by design is in correct or appropriate relative position with above or below light-emitting ziodes (LEZ's) built or formed disposed on spatially connected to on inner or outer lamp shade sides or beneath a fixed light structure apparatus the LEZ-light fixture configured to reflect and to control the bounce of light bands, from a plurality of mirrors attached to, increases photo-zolectric Light Energy Collection on outer rim of a plurality of fixtures.

The pre-determined embodiment for lamp shades disposed on primary level—the inner chamber area, wherein the primary level is either the inner or outer chamber formation on the inside for lamp shades photo-zolectric/photoziode device, configured in the reverse positional aspect depending on concentrated constructional design implementations. Wherein a sub-chamber or subsequent chambers, including a plurality of cooling chambers between each zolar-chambers are configurable in a pattern allowing light rays from light-emitting devices to pass through each chambers zolar-film surface in calculated zolar arrangements of, or zoned matrix array of the zolar-cells or zolar-cell modules with a dual purpose to illuminate surrounding area and project image independently or simultaneously. Wherein photo-zolectric/photoziode device further incorporates at least one photo-resistor or Light Dependent Resistors (LDR), or both at least one photo-resistor and a LDR; wherein the ZSC detects and records variables in resistance level change according to concentrated connections between or with one or more zolar-cell or zolar-cell module devices net-gated within at least one arrays on within a chamber or subsequent sub-chambered layers, wherein light intensity rays are extreme, certain LDR's or photo-resistors respond activating configured areas within at least one zoned matrix to maintain battery-charging even if device is turned off for the purpose of future illumination or charging external items.

A preferred embodiment for photo-zolectric/photoziode energy system consists of one or more layered zolar collector chambers, mainly due to light itself comes from different angles. Thus the need to layer under and over the primary layer, with subsequent layers from a plurality of calculated shaped photo-zolectric zolar-cells or zolar-cell modules, zPanels may be flat or having angular curvature including zolar-cell or zolar-cell module configurations compounding photo-zolectric/photoziode zolar arrays around and beneath the primary level and on all outer edges, collecting all shift variations of incoming light-emitting rays that further increase photo-zolectric capabilities. Effectively maximizing light energy production for each matrix array collector system, thereby reducing accumulated heat energy, provided by buffer zones between chamber layers of forced air or exhausted as heat rises on lamp shades of a liquid matter, or of additional substances or matter not listed or capturing exhausted heat for the purpose of additional energy generation from zPanels, or of a plurality of zolar panel systems not listed.

A similar preferred embodiment directly related to the aforementioned, angular curvature photo-zolectric zolar-cells or zolar-cells modules may each be in a angular position in relationship with surrounding or above zolar-cells or zolar-cell modules on primary or subsequent layered photo-zolectric/photoziode zolar-cell or zolar-cell modules field formations, with a plurality of associated mirrors. Further redirecting drift light-emitting rays to specific photo-zolectric/photoziode arranged zolar-cell or zolar-cell modules within supplemental sub-surface layered matrix array's of one or more layers. In doing so, further reduces heat load related problems, since light-emitting rays and their associated atoms are either slowed while being cooled and or captured on different layers. Wherein buffered cooling zones between the outer and inner chambers on lamp shades, fixed or mobile Zolar-Light fixtures and those photo-zolectric/ photoziode arrays attached to a plurality of zolar panels (zPanels). The process controls and expels heat effectively, allowing increase in controlled light energy watt generation.

A recognized embodied designation in zolar panels (zPanels) and fixed or mobile Zolar-Light fixtures including street lights, also known as zLamps; wherein each are built or formed disposed of a plurality of differing divergent configured zolar-cell or zolar-cell modules and a plurality of mirrors, managing spatial discipline formations within between inter-connected clustered matrix arrays, allowing natural light rays in, or artificial light out through a plurality of at least one array or matrix configurations of LEZ's inter-connected to one or more base units, comprised of a LEZ-light fixture; wherein the manipulation of sub-chamber configurations are further equipped the a plurality zolar-cell or zolar-cell modules maximizing absorption rates below or above each layered chambers configured space juncture, with one or more cooling chamber compartments between one or more layers reducing the associated heat load discipline, thereby increasing light energy generation.

A correlating embodiment, comprising zolar-cell modules of a plurality of designed elements concentrator photo-zolectric (CPV), high concentrator photovoltaic (HCPV), Luminescent solar concentrators, and additional types of PV systems being considered or in RD for production; each individual zolar-cell may be shaped in a plurality of sizes, or shapes of a triangle, round, rectangular, etc., not just square shaped ZC's. Wherein the distance between each zolar-cell or zolar-cell modules (ZC) is regulated in architectural designed features enhancing spacial distance, in controlled spatial point clusters, allowing incoming light-emitting rays either natural or artificial light to pass beyond the primary origination level mitigating a plurality of known difficulties such as heat occurrences, whereby subordinate chambers further collect remaining or redirected drift light-emitting rays; wherein air chambers between effectively cool primary, including supplemental compartmental chambers.

According to another preferred embodiment, wherein positioning each photo-zolectric zolar designed arrangement, virtually eliminates heat, due to light passing between one or more cooling chamber and spatial arrays, system controlled heat dissipates as light-ray bands are captured on multiple layers. Each layered zolar-cell or zolar-cell modules within an array field below the primary and subsequent chambered layer are electrically interconnected forming a zolar photo-zolectric cluster array panel system. Wherein one or more concave, concavex or bowl shaped clustered arrays of three or more ZC's on subsequent layers catch or absorb additional light-emitting rays reducing heat loads, thereby increasing zolar efficiency. Such areas between the zolar-cell zolar or zolar-cell modules zolar arrangement field are inter-connected within the same or subsequent layered fields. The areas between is configured spatially, allowing controlled light rays to pass between and beyond each ZC's connection points on primary and subsequent sub-chambers layers.

Currently, light-emitting rays have no where else to go currently except to collide on just one layer waiting to be absorbed, causing heat; wherein manipulated passages onto subsequent sub-chambered layers of a plurality of zolar arrangements with a plurality of the zolar-cell or zolar-cell modules built or formed in a plurality of compartmentalized chambered layered fields decreases heat loads and increases watt generated.

Wherein free uncollected light-emitting rays enter the next chambers zolar arrangement field, comprised of configured shaped fields, e.g. hexagon, elongated rectangle, etc. Wherein subsequent chambers may be of the same zolar-cell collector size field may be smaller or larger in each zolar-cell or zolar-cell modules size dependently or independently configured in at least one array, concentrated within a specific field beneath primary and subsequent fields above or below substrate material are built or formed disposed in zPanels Zolar-Light fixtures, zLamps and zLamp-shades; gathers the remaining light-emitting rays, in turn further minimizing surface heat loads from certain areas within different clustered arrays in a zoned matrix, assisted by each buffer field or cooling chambers.

A predetermined embodiment, comprising photo-zolectric/photoziode zolar-cells or zolar-cell modules within each photo-zolectric matrix array are configured by design to enhance abortion from the plurality of light-emitting ziodes on the LEZ-light fixture, each Ziode is in unison with a plurality of shaped mirrors configured in angular positional orientations upwards, downwards or center line to vertical or horizontal axis, or both vertically and horizontally for zLamp-Shapes, zLamps or a zLamp light fixtures. That is to say at least one mirror supports drift light rays redirected towards at least one photo-zolectric/photoziode zolar-cells module or zolar-cell modules, supported by at least one light-emitting Ziode module, each in proportional relationship to at least one configured array within a specific matrix zolar arrangement cluster. The desired state within the apparatus applications includes a comprehensive arrangement of at least one or more mirrors that may be made of polished aluminum, or additional materials not listed, and further sealed with a protective reflective coating; wherein the UV-Strengthened Aluminum mirror is shielded by UV layered application prolonging life and prevent damage thereto. Various applications may require extremely low thermal expansion application or to increase reflectance capabilities; wherein protection options needs are suited for certain environmental configurations, e.g. external elements or for interior usage, mainly since bare aluminum is extremely delicate and susceptible to damage.

According to specific embodiments, the photo-zolectric system is configured to generate direct electrical energy for charging a plurality of rechargeable batteries. The ZSC verifies generated photo-zolectric zolar power output capacity from a plurality of matrix arrays, directing some or all light energy generation to at least one configured battery-charging system controller, from direct electrical energy generation from the one or more arrays within one or more matrix's, converting clean electrical energy for charging the rechargeable batteries controlled by the battery-charging system. Wherein the battery-charging system controller includes one or more DC2DC converters, configured to convert such light energy generation to clean direct electrical power charging a plurality of rechargeable batteries gate directed to DC charging port for external smart devices and or channeling watt generating power directly to a plurality light-emitting ziodes on a plurality of LEZ fixtures built or formed in unison with one or more arrays interconnected within one or more clusters configured within a quadrant or a matrix. Thus allowing one or more calculated configured zolar-cell or zolar-cell modules groups of arrays or one or more groups of clustered arrays within one or more matrix's, in gate directionally determined hierarchy with one or more light-emitting ziodes on the LEZ-light fixture generating light energy power, within one or more matrix's in a similar proportionate coordinate group with a plurality of zolar-cell or zolar-cell module collectors that are inter-connected gating power to the battery-charging system controller, to one or more LEZ's and the battery-charging system controller simultaneously as determined by the ZSC.

A preferred embodiment within the light energy generation system comprising at least one or more photo-zolectric photoziode cluster matrix array's or quadrants that are inter-connected with one or more LICCMA's on at least one or more quadrants or clusters in a chambered layered surface area. Maximizing light-emitting energy generation to the sum total of entire connection points for each array within one or more clusters from certain matrix's, where light energy is at its highest out-puts combined, gating energy generated power to one or more smart devices.

A performance embodiment comprising each photo-zolectric devices are comprised of one or more photo-zolectric zolar-cells or zolar-cell modules arranged underneath configured LIER areas on primary level coincide with similar zolar arrangement areas on each subsequent chambers allowing determined artificial light rays generated from a plurality of light-emitting devices ziodes or a plurality of the LEZ-light fixtures, in conjunction with natural light rays on outer chamber surface collecting or absorbing additional light energy generation from lamp shade bulb device or the LEZ-light fixture mounted inside the zLamp-fixture, zLamp-shade or zLamps with predetermined configurable amount of light-emitting rays to pass through each chamber surface illuminating surrounding areas.

Relating to the term 'lamp shade enclosure' each are fully or partially sealed separating each component part, comprised of a plurality of materials of carbon fiber, ceramic, metal, or of additional materials not listed; wherein one or more encloses fully contain each part or lamp shade devices within, light-emitting Ziode or LEZ-light devices and zolar-cells or zolar-cells modules encompassed in a clear enclosure ensuring the protection of each light structure apparatus system from surrounding elements, especially those zLamp-Shades that are fully and or partially enclosed for outdoor usage. Each light-emitting device—LEZ-Light fixture or the chambered matrix arrays zolar-cells or zolar-cell modules within apparatus may be independently or separately enclosed from one another protecting from weather elements of water and or dust, etc.

Another performance standard of the plurality of configured areas between configured positioned SLM on curved or flat surfaces on a zPanel, zLamp, zLamp-fixture or zLamp-shades allowing the control of zolar ray collection absorption evenly distributed over the primary surface or subsequent chamber surface areas and their zolar fields on undersides, minimizing heat loads currently experienced with traditional panel designs.

In accordance with a preferred embodiment of the present apparatus, zolar panels and outer surface edge for zLamp-Shades are built or formed disposed of or with a plurality of solar cell technologies depending on production locality within certain geographical areas based resources available; of multiple layered crystal silicon, polycrystalline silicon, polymer zolar-cells or zolar-cell modules, organic zolar-cells or zolar-cell modules, thin film technologies currently being development or considered, a thin-film copper indium gallium selenide materials or current and future technologies in the design and building or forming of a plurality of zolar cells. Wherein said photo-zolectric zolar-cells or zolar-cell modules are arranged in clusters of arrays within at least one matrix such configurations are calculated based on geographical deployed locations, watt generation output, size of fields or panel of each primary chamber in coordinated arrangements with subsequent chambers separated by one or more air chambers, maximizing light energy generation.

System designed chambers formations on zLamp-Shades and flat panels of a plurality of sized configurations for fixed lights including zLamp street lights, may further be equipped with zolar panels of a plurality of designed elements from: Concentrator photo-zolectric (CPZ), high concentrator photo-zolectric (HCPZ), High concentration photo-zolectric (HCPZ), Luminescent solar concentrators, and others types of PZ systems being considered or in research and development. Wherein a preferred deployment for street lights (zLamps), comprised of at least one matrix having at least four zoned quadrants designed of a plurality of shapes and sizes on outer surfaces of a street light fixture and of similar properties within the light devices frame or housing and on its inner walls divided up into quadrants sections assisting in the mapping of each zolar-cells or zolar-cell modules indicating locations as data messages are being sent to the ZSC; wherein below is at least one light-emitting device configured in tubular round pattern, or additional shapes not listed; wherein the zolar field on bottom side of tubular device, or additional shapes not listed are built or formed with a plurality of light-boosted LEZ's or LEZ-light fixtures, or both light-boosted LEZ's and at least one LEZ-light fixture, to illuminate surroundings, equipped with a battery-charging system controller and a plurality of batteries.

Currently Perovskite being somewhat inexpensive production material, replacing the expensive crystalline silicon; however this preferred embodiment perovskite, may be preferred in the manufacturing of zLamps-fixtures, zLamp-Shades and zPanels, made of into a very thin nona matrix layers; wherein allowing light-emitting rays to pass beyond primary arranged zolar-cells or zolar-cell modules and subsequent chambered configured layered fields within one or more inter-connected layered matrix's, certain types of light structure apparatuses including zPanels may include light-emitting devices (LEZ's) attached to a outer surface side, or on bottom of outer primary chamber layer for the display of system readiness, capacity output variables and more.

Each individual zolar-cell or zolar-cell modules may be shaped in, as triangular, round, rectangular, octagon, or additional shapes not listed etc., not just the standard square shaped solar cells which limit the apparatus design features. Wherein the distance between each zolar-cell or zolar-cell modules (ZC's are of a similar configuration internally as in solar cells of square configurations) each are regulated in architectural designed features enhancing spatial distance, controlled space allows incoming light-emitting rays either natural or artificial to pass beyond the outer primary chamber level mitigating a plurality of known difficulties in subtle heat occurrences, whereby subsequent chambers further collect remaining or redirect drift light rays, between air chambers effectively cooling, including supplemental photo-zolectric compartmentalized subsequent chambered layers supported by a plurality of directional mirrors. Hence further influencing drift light waves and their associated scattered molecules and particles not only in the atmosphere entering a zLamp or zPanels outer edge but also artificial light rays inside from one or more configured mounted LEZ's light fixture that are enclosed in a structured enclosure; wherein total horizontal, vertical and angular insolation are collected effectively by sub-chambers, thereby widening total incident energy generation.

In accordance with the preferred embodiments, photo-zolectric zolar-cell or zolar-cell modules configurations on surface areas are layered. Wherein the second or subsequent chambered layered photo-zolectric zolar-cells or zolar-cell modules may be comprised of a concave, or additional shapes not listed configured nano shaped arrays; wherein outer surface edges are higher than center connection point of each clustered ZVP; such as without limitations convex and or a convex incurvate design with mirrors on the inside of structures or frames refracting or reflecting light rays towards the underside of chambered layers flexible film. Thereby collecting maximum light rays between connection threads on primary arrays and subsequent chamber levels or layers. System may be further built or formed disposed on a third or additional layers, with buffer zones (cooling chambers) between each chambers layer allowing concentrated heat controlled exhausted by one or more means, e.g. warm air rising for zLampShades, zPanels, zLamps and zPanel fixtures, or by forced air creating additional energy or using a plurality of fluid substances, or of additional matter not listed. Wherein each layer has spatial zolar arrangements for light-emitting rays to pass through from configured light bulb, LEZ-light fixture or one or more Ziodes positioned within the apex or center of the zolar apparatus, further illuminating surrounding areas from lamps shade by one or more LEZ's or fixed Zolar-Light fixture and projecting configured images. Furthermore, heat itself actively being removed from each photo-zolectric system determines a conformance broadening light energy generation capacity.

In reference to the aforementioned claimed embodiment, wherein a preferred configured zolar-cell or zolar-cell modules zolar arrangement comprised of a convex incurvate designed shapes concavex, or of additional shapes and designs not listed herein. Wherein the outer surface area of a zolar-cells or zolar-cell modules and there arrangement configuration comprise a concave curved pattern exterior of a circle, sphere or bowl; wherein the center portion of each zolar-cell is shaped in a reverse convex manner a concavex (CNCVX) configuration, rising upward in center area that may be or not a smooth rounded point or merely vertical rounded in a angular vertical circumference pattern sides all based on primary base footprint or shaped scheme; wherein all base surfaces (circuit board or nano configured base plane) may be further configured in one or more nano inter-connected shapes, e.g. octagon, hexagon, pentagon and additional types of divergent configured formations of the zolar-cells or zolar-cell modules attached or configured thereto in a similar relational pattern. The intersect point area where the reverse concave outer rim field turns upward, this area may be smooth, curved downward surface or connected diagonally or angular directions with surrounding interconnected zolar-cell or zolar-cell modules. This preferred configuration allows light rays both natural solar or artificial light-emitting rays from ziodes or from light devices increasing maximum absorption from concentrated zolar-cells or zolar-cell modules beneath or beyond a primary surfaces depth.

In further reference to the above embodiment comprising the associated shapes of a convexo-concave, convexo-convex or concavex, or combinations thereof of each photo-zolectric zolar-cell or zolar-cells modules configuration for zLamp-Shades, zLamp Fixtures and zPanels. Wherein on inner side of a thin or nano thin layered zolar-film are sets of a plurality of configured shaped zolar-cells or zolar-cell modules grouped, and in a proportional relationship on the opposite or underneath side of the zolar-film, separating zolar-film layers with an arrangement of a honey comb buffered air chamber. This preferred embodiment, sets a standard for a fixed or mobile zolar light structure apparatus, wherein light energy generation is directed towards inner side of the zolar-film layer attached thereto a plurality of inter-connected zolar-cells or zolar-cell modules collecting artificial light rays from a plurality of combinational of clustered arrays within one or more matrix's in a horizontal or vertical position within center of zLamp-Shades, zLamp-fixtures, zLamps or zPanels zolar system's field a light-emitting device along with natural light rays being collected from one or more chambers on outer surface structures area; wherein such device is configured proportionally shaped set with multiple ziodes aimed in configured orientation at specific clusters of arrays within one or more matrix's; wherein on outer surrounding surface area on the same chamber attached thereto back to back on the zolar-film, or additional inter-connected zolar-cells or zolar-cell modules of additional designs not listed collecting natural or artificial zolar rays from out side the surface area, including on zLamp-Shades, zLamp-fixtures and zLamps enhancing the light energy generation system.

One or more light-emitting ziodes are equipped with a magnifier; wherein the magnifier is similar to a magnifying glass that controls one or more ziodes light rays intensifying surrounding illuminated area; wherein these light-emitting boosters not only aid in controlled rays, they boost configured image magnification projections. Such light-boosters further known as maglight-boosters, are shaped in one or more configurations, e.g. concave, convex, convexo-concave, convexo-convex or concavex configured combinational shaped devices, or additional shapes not listed. Furthermore at least one ziode may be equipped with multiple light-boosters such that the illuminated projected light pattern from one or more ziodes grouped pass through a similar, or a plurality of shaped light-booster; wherein the magnification encompasses a group of independent light-boosted ziodes or a combination one or more configured ziodes point-aimed at one or more light-boosters, further intensifying illumination of residential and street lighting of a defined area.

The zolar system apparatus is further configurable for street lighting; wherein the ZLamps are designed in plurality of structured shapes: round, square, rectangular, or additional shapes not listed, disposed of a plurality of elements such a ceramics or synthetics, or of additional substances or matter not listed that withstand the elements of weathering is configured on the top level layer of the zolar-cell or zolar-cell modules chamber covered with similar technologies as solar shingles hereinafter referred to as Zolar-Shingles; wherein the zolar arrangements of the plurality of the zolar-cells or zolar-cell modules within chambered layers are built or formed in a plurality of patters.

Furthermore, convexo-concave, convexo-convex and or concavex configurations are disposed on one or more zolar-cells or zolar-cell modules individually configured as a group of at least one array inter-connected within one or more clusters configured as in quadrant or at least one matrix configured within a thin zolar-film inner side of outer chamber below a clear protective covering above and below thin layer zolar-film and on chambers underside a plurality of the zolar-cells or zolar-cell modules configured within the thin layered zolar-film, separated by a protected layer a buffered honeycomb compartmentalized air or liquid cooling chamber between a plurality of chambered thing zolar-film layers of the one or more zolar-cells or zolar-cell modules within a plurality of the chambered layers for various shaped zolar panels; wherein the zolar-film is comprised of a plurality of material substances, designed features, thicknesses and configurations.

Another preferred embodiment of the sustainable light energy generation system, comprised of a plurality of shapes fixed light fixtures Zolar-Light fixture, wherein along the inner edge of frame fixture made from metal, plant synthetic composites and hemp, or of additional elements not listed; whether rectangular, round, circular, etc., positioned on the leading edge attached to each fixture are one or more angular array of mirrors, comprised of flat, convex, concave, concavex or combinational groups of one or more shapes, or of additional shapes not listed redirecting drift light-emitting rays along the leading edge of each fixture bounding, refracting or reflecting towards at a predetermined or calculated position of the zolar-cells or zolar-cell modules within an array, cluster, quadrant of matrix area, again maximizing light energy generation and further designed to allow concentrated amount of light rays to pass through a zLamp or zPanels.

An advanced embodiment for each light-emitting ziodes having parts of or all there light-emitting rays directed towards specific certain group of photo-zolectric zolar-cells or zolar-cell modules within at least one quadrant or a matrix area or field. Such that each light-emitting ziodes (LEZ's) on the LEZ-light fixture, LED Bulbs or of additional LEZ-light fixtures, or of a plurality of group LEZ not listed, are shaped in directional accordance with one or more a group of a plurality of the photo-zolectric zolar-cells or zolar-cell modules positioned within zLamp-Shade, zLamps, zLamp-fixtures or zPanels. If the shape of the lamp shade has six sides, four sides or for that matter a round lamp shade; so shall the LEZ Bulb be built or formed of a corresponding shape, or light-emitting ziodes mounted on the LEZ-light fixture, that may be further equipped with at least one light-boosted ziode; wherein Ziode alignment is tuned with and on each chambered matrix group or layer of zolar-cells or zolar-cell modules that further enhances the sustainable light energy generation.

Another similar advanced embodiment in conjunction with the above embodiment, comprised of at least one LEZ-light fixture the LEZ's are built or formed in a prismatic configuration, or of additional designed shapes not listed, having one or more horizontal or vertical sharp or smooth angular turns corresponding to zLamp-Shades interior shaped designs.

Another accompanying advanced embodiment in conjunction with the above embodiment, linking the two previous embodiments, ZSC provides an alignment feature when placing the zLampshade on to a bracket with a plurality of concentrated configured LEZ's comprises an LEZ-light fixture. Turning the lamp shade clockwise or counterclockwise when positioned properly, LED display light turns on, indicating the bulb device or ziodes in a configured corresponding formation aligned with one or more configured matrix group of zolar-cells or zolar-cell modules indicating unison or alignment. The feature is similar to aligning a satellite dish receiver with a satellite or tuning in a radio station, one or more light sensors are activated when internal light rays and one or more zolar-cells or zolar-cell modules are in concert for maximum sustainable light energy generation.

Controlled transmission of light-emitting rays on surrounding surface areas around zLamp-Shades, such calculated areas between photo-zolectric matrix arrays and their inter-connected zolar-cell or zolar-cell modules are configured on inner and outer surface areas, areas provide calculated spaces between zolar-cells or zolar-cell modules within arrays predetermined zolar arrangements allowing controlled illumination beyond zLamp-Shades surrounding surface and the projection of targeted light rays on near objects, e.g. floors, walls, etc. or images generated by a plurality of light-emitting ziodes of different colors mounted on LEZ-light fixture, or below the outer primary chambers protective covering in a spatially coordinated design structured placement.

The sustainable light energy generation system further comprises a system interface, wherein one or more light-emitting ziodes one the LEZ-light fixture and their associated rays in conjunction with production of electrical currents are compared against or with one or more clustered arrays from each matrix or at least one quadrant, ZSC's determination control regulates such light energy generation diverted to either battery-charging system controller, light-emitting devices or external charging port, or charging battery-charging system and external port at the same time.

Another predetermined preferred embodiment, comprising the photo-zolectric zolar-cell or zolar-cell modules configurations on both sides of inner chamber, such that inner chamber has a layered field within the chamber, comprised of a second or additional air chambers between each inner and outer chamber fields built or formed of a non-reflective zolar-film, or of additional materials or substances not listed. Wherein the inner outer side of chamber fields of the zolar-film, on inside of the photo-zolectric chamber the plurality of zolar-cell or zolar-cell modules zolar arrangement field is separated by an additional air chamber attached to the outer photo-zolectric zolar-cell or zolar-cell modules chambered fields of the zolar arrangement on the inner side, collecting or absorbing artificial light-emitting rays from the surrounding area outside light structure apparatus.

The aforementioned embodiment may further comprise only one chamber; wherein there are multiple photo-zolectric matrix's on outer or inner side proportionally designed allowing configured light rays to pass from within illuminating surrounding areas outside zLampshade or zLamp. That may be separated or not by an air chamber with just one additional photo-zolectric chamber on the opposite side, either below or above the air chamber. Each chamber configuration is layered with zolar-cells or zolar-cell modules in concurrent support of each other and fully inter-connected, allowing configured light rays from light-emitting device to illuminate surrounding areas outside; wherein the zolar lamp {also known as a zLamp} system provides sustainable power from generated light energy, either artificial or natural rays.

Currently industry awareness determines a single module is enough to power emergency telephones. Thus, advanced zolar arrangements using one or more photo-zolectric inter-connected cluster matrix array configured with a plurality of the zolar-cells or zolar-cell modules within chambers provides affordable sustainable light energy generation for zLamp-Shades, assorted Zolar-Light fixtures and zolar panels (zPanels). Capacity power for photo-zolectric systems are measured as maximum power output under standardized test conditions as $W_p$ (Watts peak) by gating power from multiple clustered arrays combined from within additional matrix's, concentrated with at least one or more connected matrix chambers in series, parallel series or vis-à-vis or combinations thereof, from one or more chambers maximizes sustainable light energy generation.

The sustainable light energy generation system, on Zolar-Light fixtures, zLamp-shades and ZLamps, where certain models are further equipped with light intensity control rheostat, a potentiometer or a digital logic (ICs) circuitry, or a model includes each a rheostat, a potentionmeter and a digital logic (ICs) circuitry. Wherein all or parts thereof on the LEZ-light fixture, change brightness intensity on all or parts of a configured surface area, on quadrant portions or merely a quadrant on either the X or Y plane axis. Such controlled manipulation, allows a plurality of Zolar-Light fixtures, zLamp-shades and zLamps to project one or more images emblematic or heraldic arrangements by controlling each LEZ's elements on the LEZ-light fixture to turn on or off, to change to a different color, to increase magnification, to activate one or more light-boosted LEZ's in a particular formational design or designs.

Another preferred embodiment is entire system on advanced models are controlled activated by a smart device or a desktop application, capable of controlling one or more Zolar-Light fixtures, zLamp-shades, Zolar-Shingles, zLamps or zPanels from remote locations.

A further embodiment is a quadrant control device controlled by the ZSC, controls which area around a zLamp-shades that turns off or back on one or more of the four equal or corresponding sectional parts of a zLampshades surface area light-emitting ziodes on the LEZ-light fixture, light-emitting bulb devices, or a plurality of one or more. Thus allowing controlling certain areas on zLampshades surface sides, only for reading purposes and directional illumination, saving light energy generated power, further increasing the sustainable light energy generation system's charging capacity, providing excess power to charge external items in need of DC power.

A pre-configured embodiment of entire ZSC's formational design may be built or formed of a industrial digital circuit controller, pre-configured to perform and control by a least one non-transitory computer-readable medium processing a plurality of algorithm of the data messages being received logging said messages in a plurality of mediums from the plurality of zolar-cell or zolar-cell modules readings comparing and determining a deterioration rate or factor, a life expectancy or a end-of-life cycle of plurality of zolar-cell or zolar-cell modules in a plurality of arrays, clusters or quadrants; and to further control power distribution rates or factors, of the plurality of LEZ's on the LEZ-Light fixture; wherein the ZSC's records the environment attributes of each functional components within the sustainable light energy generation system in a plurality of computer readable mediums on one or more digital circuit boards, attached inside a base unit structured housing framework. Wherein zolar system comprised of a plurality of electrical circuits comprised of one or more circuit types' e.g. analog, digital, mixed or hybrid circuits signal configurations and of additional circuities not listed; wherein one or more functions incorporate Boolean logic, further assisting in the generation of analytics; where said analytics generates performance indicators sent to a users display, or a datalink with one or more receiving stations.

A specific preferred embodiment, wherein the construction of the sustainable light energy generation zLamp-shades, the base unit and its inner chambers are water tight compartments, the frame mechanism for zLamp-Shades are made of a plurality of shapes and styles, each built of formed of composite structured materials made from ceramic, plant synthetic composites and hemp, or of additional materials not listed, the ZSC and battery-charging system enclosure, that may be further enclosed within metal around or enclosed by ceramic material; wherein base unit is disposed of composite materials that may be further made of non flammable material, of the quality to with-stand outside weathering elements. The battery-charging system controller can be mounted on or within a octagon electrical conduct box used to mount ceiling fixtures are simply modified, enlarging their diameter and depth; wherein the light fixture are built or formed so that the battery-charging system controller and batteries are attached to or in a secure compartment in the based unit, or located within the zPanel, zLamp-fixtures, zLampshades or zLamps, or Zolar-Shingles wherein a modified electrical box can safely hold the battery system within it's housing sphere, compartment of structure.

Additional benefits the embodiments presented include, certain ZLampshade sustainable light energy generation system models, are only equipped with rechargeable batteries with no alternating current input capabilities. Thus providing affordable light, for reading and advancing knowledge, wherein mobile light energy generation alternatives are currently limited due to energy resources in there production of AC current. Wherein, zLamp systems may further be equipped with at least one sensor in communication with the ZSC, detecting inefficient or efficient solar radiation on a cloudy day or a plurality of weather conditions; and wherein zLamp models are built or formed with a charging port to charge external smart devices; wherein zLamp system models are further equipped with capacity to alarm owner indicating a/c switch-over, allowing owner decision over ride or not, facilitate system maintaining maximum battery charge during daytime hours or at determined time by ZSC.

A preferred embodiment for the battery-charging system controller, wherein the batteries are enclosed in a fire retardant chamber, made up from one or more of a plurality of materials ceramic, or of additional materials not listed. Wherein one or more batteries of different types, such as gel-cells, lithium-ion or current technological batteries are further separated from each with ceramic, composites or fiberglass, or combinations thereof, or of additional material not listed separating battery-charging system controller or batteries compartments or chamber layers mitigating heat or melt down, protecting the charging battery system controller by the enclosure and the ZSC; wherein each battery or compartments are equipped with a plurality of sensors monitoring individual battery heat load, charging or discharging rates and deterioration factors, logging sending data to ZSC and displaying for visual purposes.

BRIEF DESCRIPTION OF THE DRAWINGS

Hereinafter, the embodiments of the apparatus will be described with reference to the accompanying drawings. However, the embodiments of the apparatus are not limited to the diagramed examples, and multiple modifications of the embodiments are possible within the apparatus scope combined with current technologies known now or under development for mass production benefits of a typical layered inter-connected clustered photo-zolectric matrix array zolar panel system.

FIG. 5 is an embodiment example, wherein depicts two configured zLampshade chambers constructional pattern designed of formational shapes built or formed on inner and outer surfaces of the plurality of the zolar-cell or zolar-cell modules.

FIG. 6 shows an embodiment the LICCMA a Chamber Configuration comprised of fixed panels-zPanels of a plurality of shapes, styles and size adaptation, or additional configurations not listed for zLamp-Shades Zolar-Shingles, zLamps—flat or curved fixtures, zPanels or zLamp fixtures.

In order to clearly and concisely illustrate the embodiments of the apparatus, certain features related to the embodiments of the apparatus definite shapes or sizes are omitted. Also, the configured elemental resemblance as to or the same as each element indicated have the same reference annotations in the figures whenever possible or practical so as to not convolute depictions. Additionally, dimensional aspects for layers, surface areas of zLamp-Shades and other fixed mounted light fixtures: Zolar-Light fixtures or zolar panels (zPanels) are exaggerated or schematically drawn illustrations may not reflect actual surface area sizes, some are omitted for ease to understand the overall preferred embodiments.

DETAILED DESCRIPTION THE PREFERRED EMBODIMENTS

The various examples disclosed herein relate to a preferred embodiment of the term managed used to describe the apparatus performance, hereinafter refers to the zolar systems controllers configured ability to track the generation of and consumption variables within photo-zolectric zolar system generating direct electrical current, isolating and recording performance attributes of the zolar-cells or zolar-cell modules within arrays, clustered arrays within specific quadrants or matrix area fields, producing the highest amount of photo-zolectric energy from the plurality of zolar-cells or zolar-cell modules within chosen or selected arrays; wherein each photo-zolectric device converting generated energy is tracked as to which matrix array, clusters of array within certain matrix's are generating upper limits of the plurality of zolar-cells or zolar-cell modules capabilities, gate routing such energy from certain areas directly back to LEZ's determined by at least one non-transitory computer-readable medium; wherein further managing similar output of at least one zolar-cell or zolar-cell modules of lower generating capacities connecting in series or series parallel or parallel based on need or calculated by zolar system controllers variable designed configurations to inter-connect with additional arrays or certain zolar-cells or zolar-cell modules within arrays of similar zolar arrangement generating capabilities or merging together each or a selection thereof of at least one zoned matrix. Then gating power onto batterycharging system or said generated power may be immediately combined providing immediate illumination and recording the consumption to one or more LEZ's configured on the LEZ-light fixture gate directing power to external charging port as required, to gate direct power to at least one screw shank, or to illuminate, to gate power to external charging port and at least one screw shank at the same time determined by the ZSC.

Figure 1:
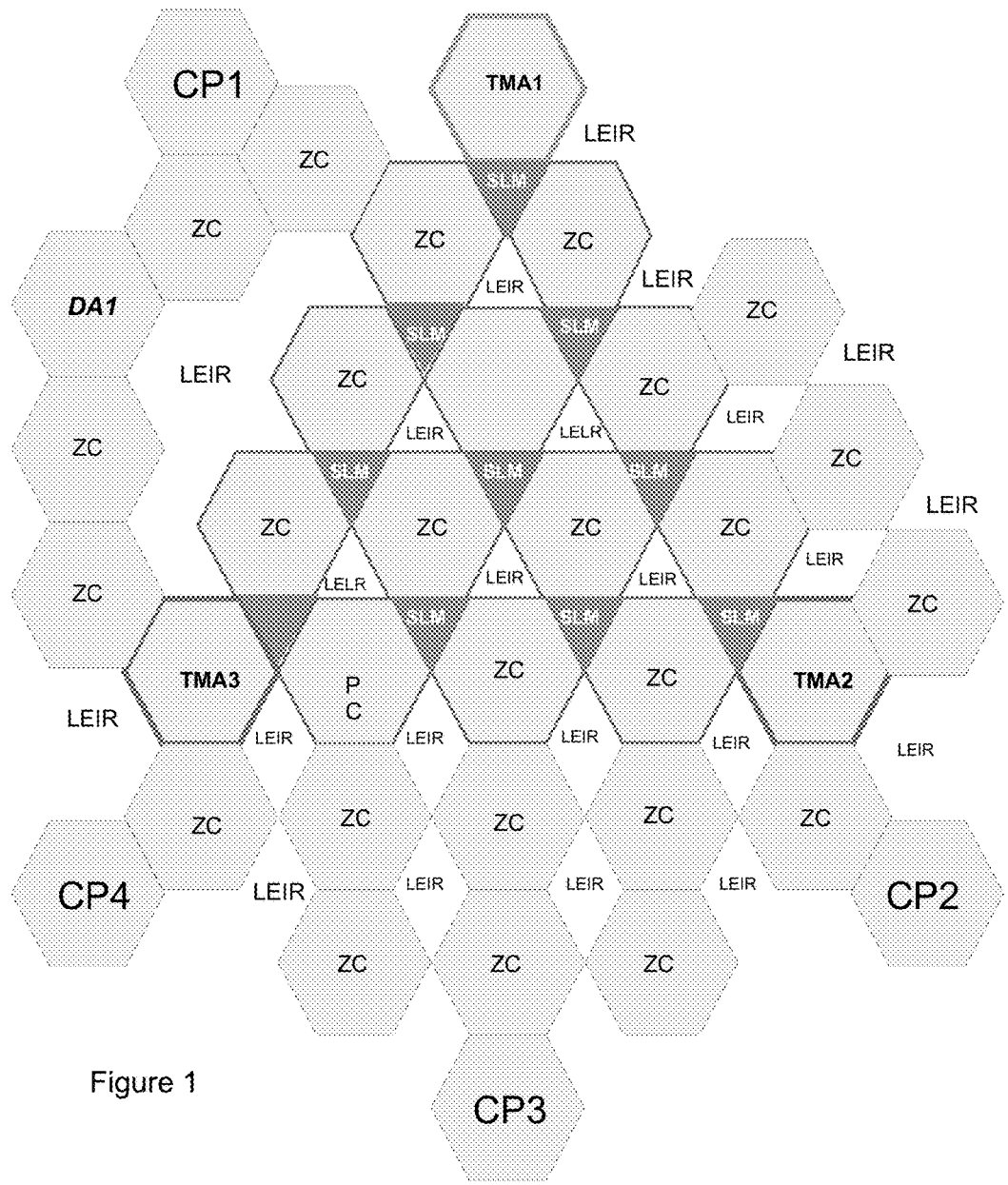
FIG. 1 provides a perspective view of a Triangular Matrix Array for the zolar-cell or zolar-cell modules configuration.

In FIG. 1 the light grey hexagon shapes (ZC), each represent one or more photo-zolectric zolar-cells or zolar-cell modules providing specified designed configured positions for within each Interconnected Layered Cluster Matrix Array, allowing light-emitting rays from bulb devices or LEZ-light fixtures, of which produce sustainable light energy generation, spacial configurations transmit light-emitting rays towards the outside of zLamp-shades are schematically of different styled shapes disposed of plurality of construction elements comprised of plant synthetic composites and hemp, or of additional elements not listed. CP stands for Connection Point, each point indicated CP1, CP2 and CP3 points are where new shaped matrix arrays are to be connected to or with one or more clustered arrays within one or more inter-connected matrix's in a plurality of configurations based on output need or for higher quality fixtures. The inter-connected hexagon depicted shapes, along with additional photoziode/photo-zolectric zolar-cell or zolar-cell module configurations are not industry standards, the resulting modifications in calculated shaping of the zolar-cells or zolar-cell modules increase the complementary complexity controlling light-emitting rays from a plurality of Ziode bulbs or a plurality of LEZ-light fixtures, either natural or artificial rays and the associated light energy generation collection attributes from a configurable lightemitting artificial bulb device or natural rays of light and their associated vector field positions.

DA1 is the start of a deflecting matrix array angle, wherein begins another matrix array of a different shape, due to angular change in axis points, wherein arrays from this point on have moved towards a different vertical or horizontal plane, similarly maintaining the continuation of another matrix array, which may be of another shape depending on such factors as to zLampshades curvature styled formation or subsequent layer configurations based on primaries sized configurations.

The darker triangle within the dark border triangular array, indicated by TMA1, 2 and 3, each 'SLM' also known as Sub-chambers or Subsequent Level Matrix Portal; below each of the darker triangles, the sub-chamber level matrix arrays absorb the light-emitting rays between connection points and or configured areas on primary and or subsequent level photo-zolectric/photoziode zolar-cell zolar arrangement. Wherein subsequent layers, even on flat zolar type panels between a buffer zone or cooling chamber, provides higher levels of sustainable light energy generation, obtain lower overall controlled temperatures, and increase higher efficiency for layered photomvalcatic clustered matrix array configurations.

Each white triangular represent LELR (Light Emitting Illumination Rays) areas between the hexagon shapes representing ZC's {photo-zolectric zolar-cell collector}, each represent a path for light from light-emitting ziode bulb above and or below primary level configured areas between PC's connection points and the associated ZC's within the array. Wherein secondary level capture directed controlled light passing through both inner from the LEZ-light fixture and outer from natural or other artificial light-emitting rays surrounding chamber on zLamp-shades or fixed zLamp-fixture or zLamp-fixture or zLamp fixtures. Wherein; LEZ's and zolar-cells or zolar-cell modules are unison generating light energy from natural or artificial light-emitting device; comprising infinitive ability to construct decorative designs within the outer chamber edge of zLamp-fixtures or zLamp-shades displaying names, e.g. ones on name, school names K-12 and beyond, academic logos, including licensing brands and their associated names from football, basketball, baseball, soccer, Olympics, wrestling and sports Xgames and their associated field of play games; dates, images of a plurality of inanimate object, including animation of the above listed items and sharing major portion of net revenue as royalties to each of the aforementioned names, brands and academic centers previously listed and a plurality of emblematic heraldic design or indicate functional system attributes displayed on outer surface area projecting said image outward or simply light to illuminate an area.

Another preferred embodiment from the sustainable light energy generation system apparatus, on lower or higher levels or solar radiation for zLamp-Shade, zLamp-fixture or zLamps, ZSC determines at least one array, cluster or quadrant area light energy generated power is sent, diverted or gated to the battery-charging system controller maintaining a maximum battery charge; wherein ZSC diverts portions of power generated to selected light-emitting ziodes in the LEZ-light fixture that are configured in unison with at least one or more zolar-cells or zolar-cell modules, maximizing charge capacity or rate by turning off determined by ZSC from messages being received from battery-charging system controller to divert all power generated from natural light from outer surfaces including from inside around the LEZ-light fixture logging the collection arrays associated with those light-emitting ziodes pointed at or on the outer edge of controlled configurable zolar arrangements, indication of minimal light rays and directed by ZSC to only illuminate surrounding areas below zLamp-shade, zPanels or zLamp-fixtures.

Figure 2:
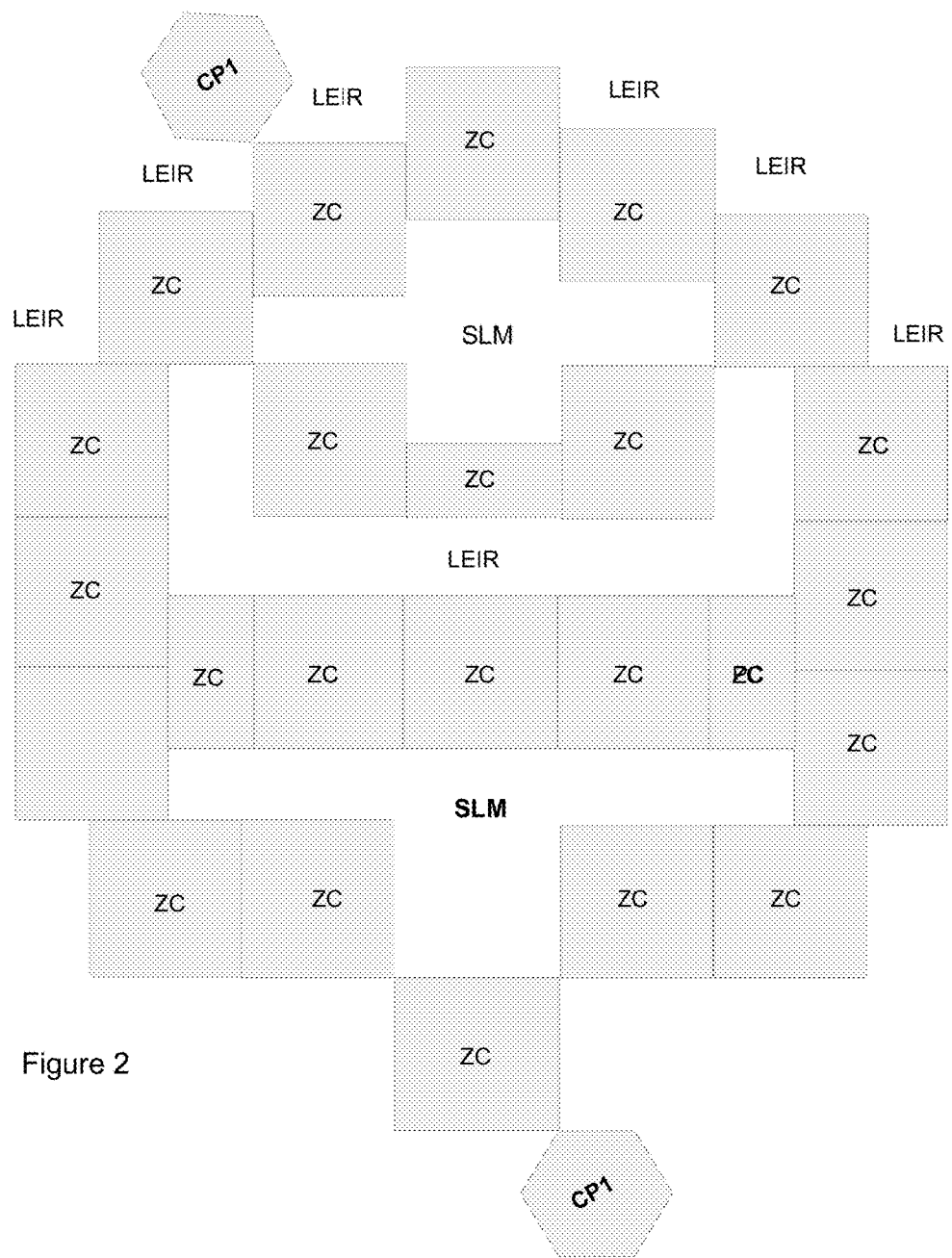
FIG. 2 is a simplified view of an Modified Square Matrix Array, configured with traditional square photo-zolectric zolar-cells or zolar-cell modules.

FIG. 2 is a Modified Square Matrix Array zolar arrangement, indicative of the squares zolar-cells or zolar-cell modules currently used within industry as a standard. The sustainable light energy generation system apparatus modifications in moving past traditional formations of solar cell shapes, surface material and layout patterns using squared cell configurations with differing shapes of an octagon, hexagon, pentagon, triangular, or of additional shapes not listed provides spacial distance in photoziode and photozolectric in the plurality of the zolar-cells or zolar-cell modules managing heat disciplines, control the collection and the distribution of light-emitting rays, e.g. natural or artificial to generate and or the illumination discipline equation for the advanced production of the sustainable light energy generation.

Figure 3:
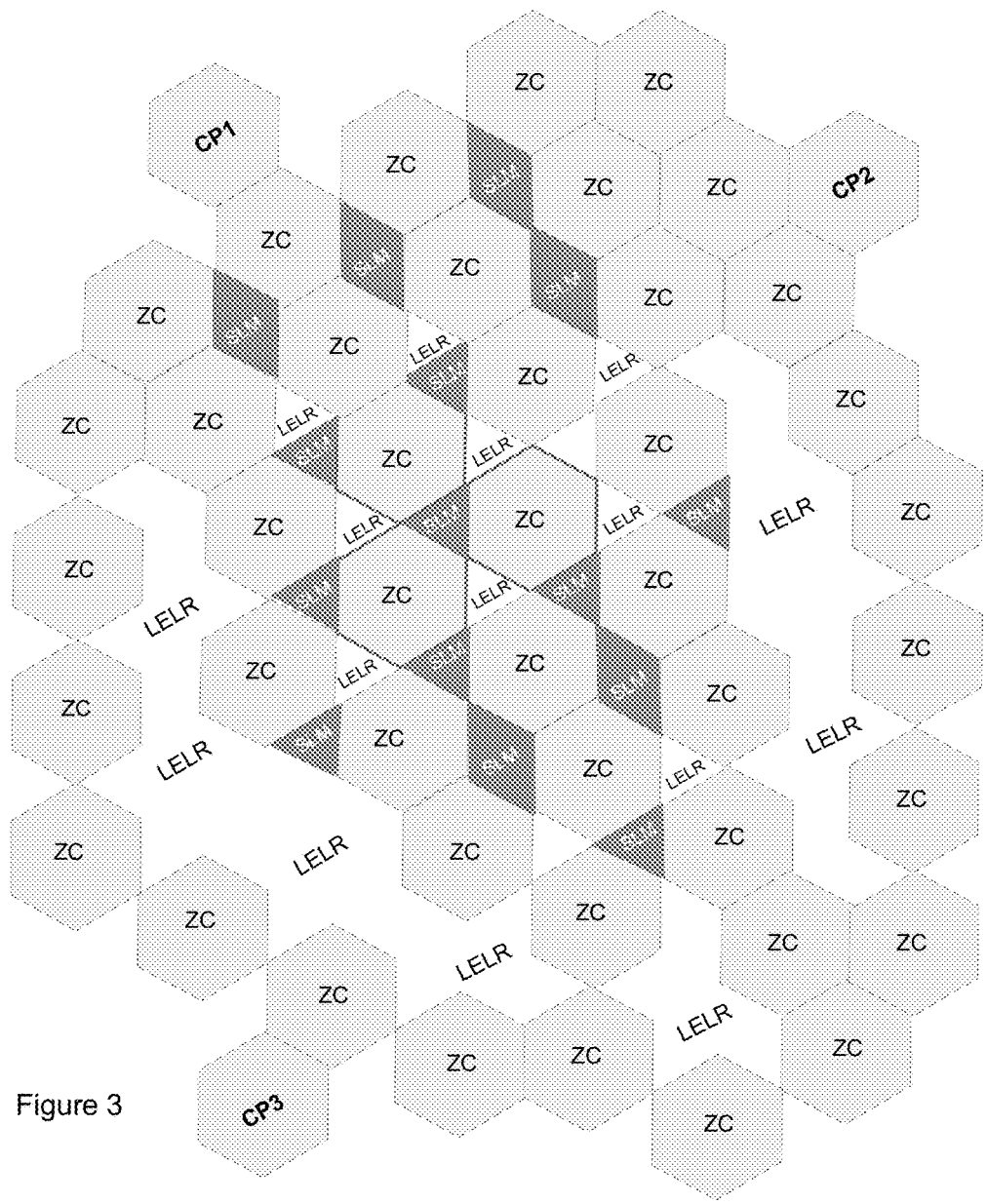
FIG. 3 is a advanced image view of a configured Modified Octagonal Cluster Matrix Array.

FIG. 3 is a modified octagon wherein the right side is approaching a vertical axis within the plane of a rounded, hexagon or octagon shaped zLampshade, or additional shapes not listed. Wherein light-emitting rays that illuminate surrounding area around zLamp-shades are configured purposely to maximize even brightness being projected by a plurality of LEZ-light fixtures and passing through inner or outer photo-zolectric collection chambers. Presently, as understood from those skilled in algorithmic variations, there are many combinational configurations at ones disposal, providing proportional relative relationship to explicit positional formations for shaped surface areas designed by a computer-implemented program method and field tested. Channeling light-emitting ziode rays in angular direction associated with corresponding or in correlation to photo-zolectric zolar-cells or zolar-cell modules, thereby maximizing sustainable light energy generation, and minimizing heat loads between chambered layers.

Figure 4A:
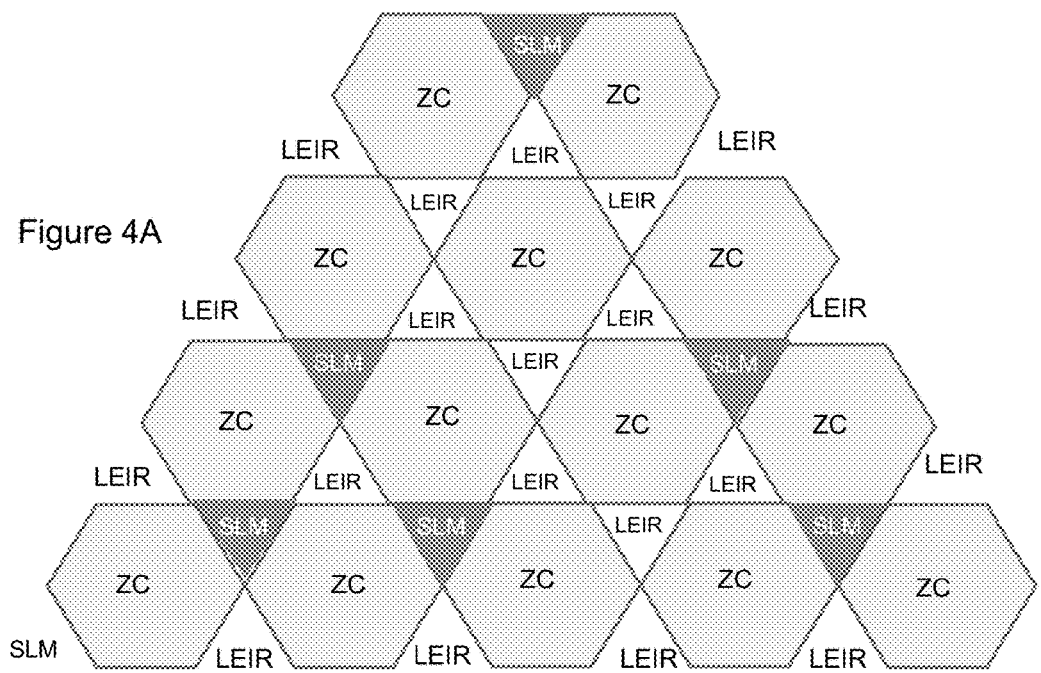
FIGS. 4A, 4B, 4C and 4D are understandable views of Layered Inter-connected Cluster Matrix Array Configured shapes for Second and subsequent Level Matrix Portal allowing natural or artificial light to pass through to at least on subsequent sub-chambers; and dimensional view of a cluster array directly beneath primary portal level SLM's, respectively of specific embodiments of the incorporated apparatus.

FIG. 4A depicts a interconnected photo-zolectric/photoziode cluster matrix array system providing maximum sustainable light energy generation. Wherein, each sub-surfaces chambers below the first level collects light-emitting rays that either primary surface is not capable of or allowed to pass through beyond the primary level purposely creating controlled configurable illumination.

As in FIG. 1 references to made herein, following the areas LEIR, SLM and CP's act in accordance to the preferred embodiments, the same as previously stated. The areas with the nomenclature regarding LEIR, such Light Emitting Illumination Ray configurations are determined by at least one non-transitory computer-readable mediums algorithms based on a plurality of zLampshade shapes, in correlation with light-emitting ziodes in at least one LEZ-light fixture, or with other forms of illumination devices in unison with a plurality of the zolar-cells or zolar-cell modules or with additional forms of illumination devices. The SLM apertures further coincides with the shape of ziodes configured to project light rays towards specified arrays within a certain clustered matrix area on secondary chamber or subsequent chambers. Wherein the zolar-cells or zolar-cell modules are attached to inner surface area of the air chamber on either inner or outer chambers, that may be filled with a gaseous element that absorbs heat or simply air vented formations on upper leading edge of air chamber, expelling radiate heat absorbed from within inner and outer chambers.

Depending on the size of photo-zolectric zolar-cells or zolar-cell modules on primary level, meaning each photo-zolectric/photoziode cluster array collector zolar-cells or zolar-cell modules themselves, can be smaller or larger on the subsequent levels in one or more configured arrays directly underneath in one or more areas within an array beneath primary level, in unison with SLM field or area. Thus providing controlled light-emitting rays determined by angular surface of both primary and or subsequent surface areas, conditions may further necessitate a third level below secondary. In doing so, configurable sizing of photo-zolectric collectors comprised of the plurality of the zolar-cells or zolar-cell modules, controls the sustainable light energy generation, further incorporates reduction of heat within each layered photo-zolectric/photoziode LICCMA chamber buffer or cooling chamber layers. Wherein the disposition of relieving accumulated heat between photo-zolectric zolar-cell collection chambers provides the ability to distinguish which arrays within a matrix or certain matrix's themselves on certain chamber levels need additional cooling parameters or light energy generation split power gated, moving such charging atoms to battery or a plurality of light-emitting ziodes on the one or more LEZ-light fixtures in unison with certain array or matrix's, intensifying less efficient or lean areas within arrays producing additional light-emitting arrays to even power distribution on either inner or outer chamber areas, directed at or to at least one particular zolar-cell or zolar-cell modules within one or more matrix clusters or arrays.

On flat photo-zolectric clustered matrix arrays, a third level collects scattered light-emitting rays purposely designed, or may be intentionally added in hotter or seasonal higher temperature climates further reducing heat loads on system from cooling chambers between each photo-zolectric/photoziode chamber.

Figure 4B:
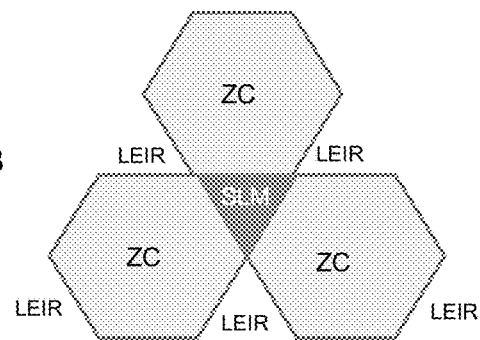

FIG. 4B delineates a single cluster array, of which the center area shown is purposely configured below SLM cluster arrays of three zolar-cell or zolar-cell modules within a selected or determined quadrant or matrix area or field at the primary level, to allow light-emitting rays to pass through primary level onto the next or subsequent chamber area or vis-à-vis, depending whether the artificial or natural light is from ziodes and additional light-transmitting devices not listed or to illuminate surrounding area of system. Furthermore, one or more clustered array within determined matrix is configured allocating light-emitting rays pass through from inner inside light-emitting Ziode area, illuminating areas outside the zLamp or zLamp-Shades circumference area or to collect natural light rays from outside on each inner chamber. Each way there are photo-zolectric/photoziode patterned arrays collecting in both directions for zLamp-shades, zPanels or zLamp-fixtures of a plurality of configured additional uses not limited.

Further as presented, the three or may be more surrounding photo-zolectric zolar-cells or zolar-cell modules collects light-emitting rays as indicated on the dotted triangle annotated with the letters SLM are comprised of additional shapes or patterns not listed of the configured SLM fields or areas shaped allowing redirected and directed light rays to pass through, captured by three or more photo-zolectric zolar-cells or zolar-cell modules dependently configured based on entrance size and shape from the previous or above level chamber layer, determine each array set of photo-zolectric zolar-cells or zolar-cell modules beneath a configured pathways. Each of the photo-zolectric zolar-cells or zolar-cell modules, individually are elevated (ES) on outer most corner sides, thus the three are concavely configured to receive all light rays that pass through portals or entrance to the subsequent chambered layers or level, one or more are connected to the neighboring arrays at the same level, creating the second level inter-connected matrix of clustered arrays.

Figure 4C:
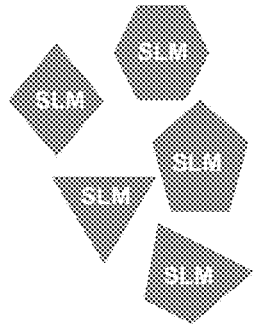

FIG. 4C is a perspective view of a plurality of chambered configurations for both zLamp-Shades, fixed or mobile Zolar-Light a plurality of the zolar-cells or zolar-cell modules, towards subsequent sub-chambers, towards one or more LEZ's in a LEZ-light fixture, or to project an image or images. Meantime, certain or ZSC selected arrays may be used to illuminate a plurality of light-emitting ziodes within panels at night or in foggy conditions, providing visual determination of system performance and location at a glance, located on sides of frame or on top.

Figure 4D:
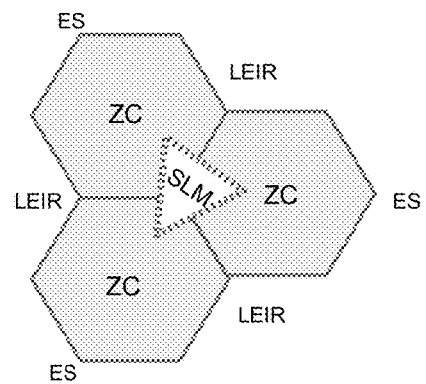

FIG. 4D depicts a zolar vocal point configured on subsequent layer, wherein one or more of the ZV point's are channel connected with one or more cluster directly above or below one or more LEIR's within one or more matrix's on primary, or subsequent sub-chambers, in electronic digital communication with ZSC, providing light energy generation functions, or watts generated in relationship with surrounding channeled ZVP's, in combinational comparison as to overall performance of entire photo-zolectric system. ZSC controlled processing is accomplished by using one or more 'digital logic circuits' inter-connected within or attached to one or more zolar-cell or zolar-cell modules, arrays, clusters, quadrants or quadrant sections configured within a matrix's in communication with ZSC.

FIG. 5 respectively displays either an outer or inner chamber area zolar arrangement for Interconnected Cluster Matrix Array chambered layer configuration for zLamp-shades, fixed Zolar-Light fixtures on walls or ceilings, and for fixed flat panel array system. Wherein zLamp-shades are built or formed with at least one chamber layer on a lamp shades inner or outer surface area, or additional models are built or formed with one or more subsequent chambered layers.

FIG. 6 comprises currently detailed seventeen (17) layers, each level the following embodiments: a primary layer on Outer Surface Area of photo-zolectric/photoziode panel zolar arrangement of one or more Layered Inter-Connected Cluster Matrix Array (LICCMA) inside primary Chamber and subsequent chambered layers; wherein each of the zolar-cell or zolar-cell modules are not only connected to moved energy generated, each of the zolar-cells or zolar-cell modules are inter-connected communicating with surrounding zolar-cells or zolar-cell modules within at least one array, and each array is inter-connected within in at least one cluster; and wherein each cluster is inter-connected within at least one quadrant or a matrix area or field each in communication with ZSC. However, from design alternatives that further minimizes heat from within each ZP comprised of additional layers within each zLamp-Shades, Zolar-Shingles Zolar-Light fixtures, zLamps, Zolar-Shingles or zPanels mounted on the ground or attached to the ground from diverse hardware equipment; on walls, ceilings hung or underneath light-emitting ziodes fixture mounted above or below LICCMA either layered horizontally or vertically, irrespective of center axis positional placement. Wherein, outer sheet or zolar-film comprises of either reflective or non-reflective or of additional elements not listed transparent or translucent film or combinations thereof between layers and the plurality of the solar-cell or the zolar-cell modules, or a covering of one or more layers each layer depicted in item numbers 2, 4, 6, 8, 10 and 12 or additional layers that are built or formed of a plurality of materials in production currently known now or in research, or of additional materials not listed for the manufacturing or forming of photo-zolectric/photoziode zolar panels. Wherein each layer is configured between at least one air, liquid or gaseous chambers 5, 9, 13. Cooling chambers are separated from below and above primary or a secondary and subsequent chamber layers comprised of flexible configured film covering of an overlay material, or of additional matter or substances not listed. Wherein chamber thickness variations are determined based on geographical areas placement that may or may not have forced circulating air or liquid matter inside or a combinations thereof, arriving from different points within a cooling chamber that may be under a determined or calculated level of pressure flow, further exhausting heat in one or more points on each zPanel, zLamp-fixtures, zLampshades, zLamps or Zolar-Shingles enclosure or cooling layers combined. The inside bottom and outside surface area of each zolar appliance, comprised of various materials that may be covered with cooling protectant, or products similar to Kool Seal or a product that is a elastic heat retardant epoxy or a composite sealant, the protective application further insulated with ceramic, synthetic materials, a plurality of composites, or of additional substances or materials not listed that seal or protects the outside of zolar structure, that may include an additional air chamber between outer surfaces container, that reduces or eliminates heat transfer from outer and inner shell surface housing or structured containers outer edges or underside of structure.

Figure 7:
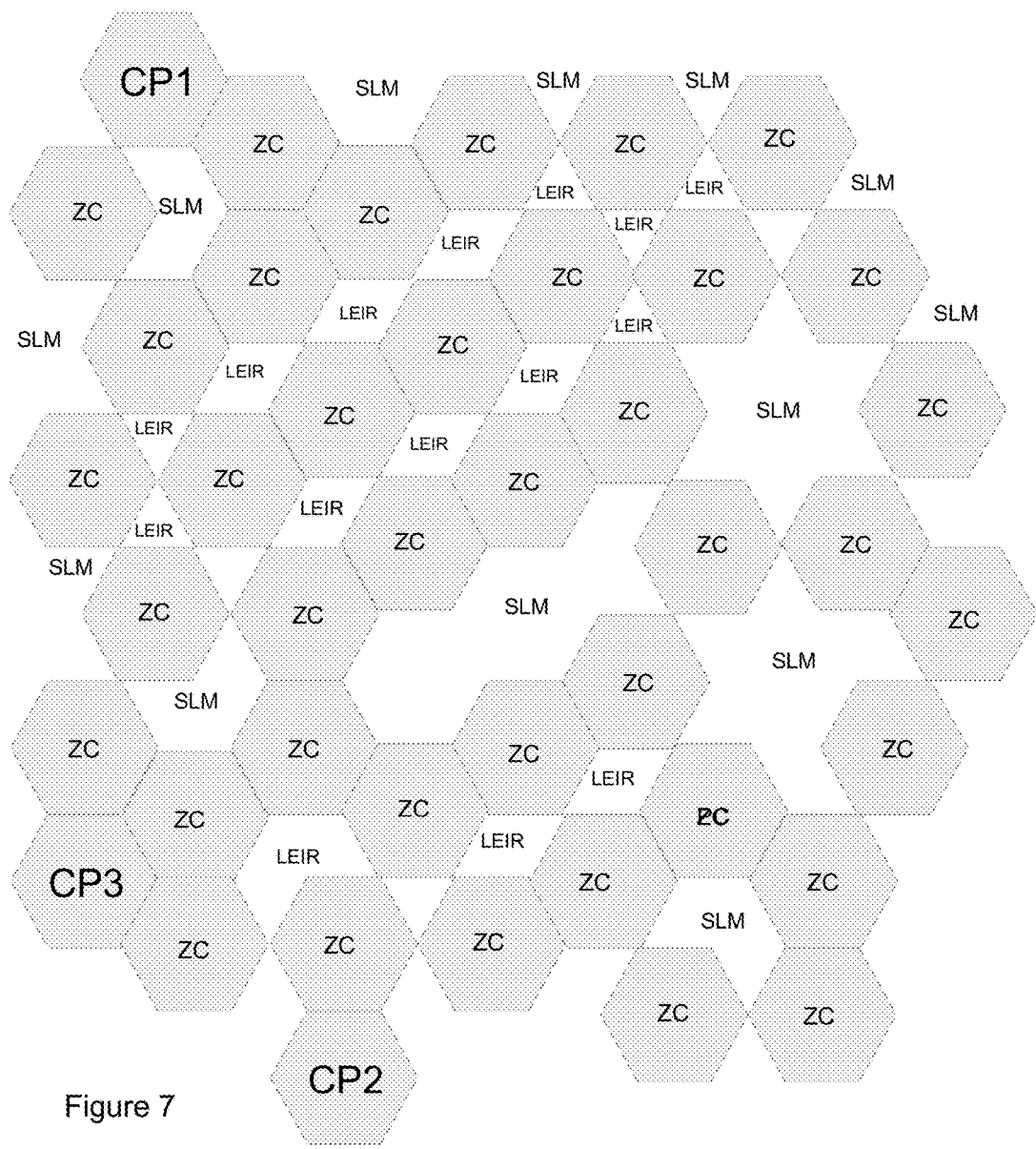
FIG. 7 respectively illustrates an example of outer or inner chambered layers architectural zolar arrangement layout, displaying Layered Inter-connected Cluster Matrix Array internal chamber configuration for zLamp-Shades, fixed Zolar-Light fixtures on walls or ceilings, fixed flat zolar panel (zPanel) systems.

FIG. 7 provides a pictorial view for outer or primary chamber, wherein additional layers are calculated by at least one algorithmic equations determining SLM's configured shapes for the primary level of the zolar-cells or zolar-cell modules positional configurations on zLamp-Shades, Zolar-Light fixtures, zLamps, Zolar-Shingles or zPanels the LEIR configurations are matched with primary in mutual relational-ship with secondary level or subsequent chambered layers or levels, allowing light-emitting rays from a LEX-light fixture or light-boosters to pass through towards outer side of the zLampshade illuminating surrounding areas. For those accomplished in the related art demonstrated and those not, clearly configured variations formed from positioning certain areas of SLM's or LEIR's, or both the SLM's and LEIR's interrelationship with additional interconnected matrix array clusters in unison patterns on primary layer or subsequent sub-chambers are unlimited. Allowing or controlling light-emitting rays directed towards explicit gateways or better known as light portals, wherein light energy generation is not only controlled, the light passing through configured directions towards specific areas, such configured spacial design manipulation is infinite in algorithmic configurable variations. Determination by the ZSC as to which clustered matrix array or particular arrays within a cluster or matrix directs light energy generation, gated to battery-charging system controller, external charging port or to gate power to a plurality of light-emitting ziodes on at least one LEZ-light fixture. Further such gated redirected light energy generation is maintained at a certain rate or level by the ZSC, based on photo-zolectric's overall performance. Wherein, the battery-charging system controller is compartmentalized, each battery of a plurality of types or sizes are positioned within a chamber of an array of batteries; wherein if one or more batteries become dysfunctional determined by each battery sensor attached thereto. Wherein a battery within a specific compartment can be removed an replaced by consumer; wherein batteries are inter-connected with a simple male/female plastic wire connected plug, further enhancing this sustainable eco-system.

Figure 8A:
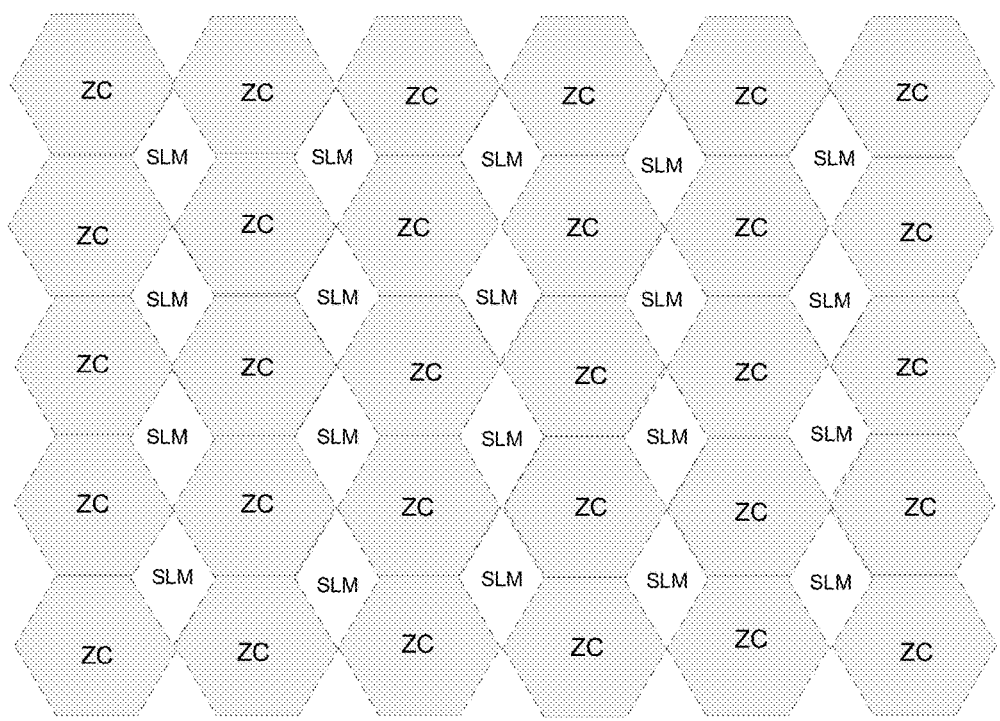
FIG. 8A provides illustrative overview configured Interconnected Layered Cluster Matrix Array Chamber Flat Panel Configuration.

FIG. 8A demonstrates a general overview zolar arrangement for Interconnected Layered Cluster Matrix Array chamber configuration for fixed flat panel array system. Wherein each spacial distance between connection points near adjacent photo-zolectric zolar-cell or zolar-cell modules the number of chambered layers are calculated based on installed conditional attributes of the geographical and surrounding weather temperatures or conditions, amount of Zolar rays determined by longitude vs. latitude variables, average ambient temperatures, average heat index for specific long/lat geographical locations, angular mount position in relation to suns angle at a given long/lat position and whether panel system is trackable mounted for each or not. For clarity purposes areas are of lighter tones.

Figure 8B:
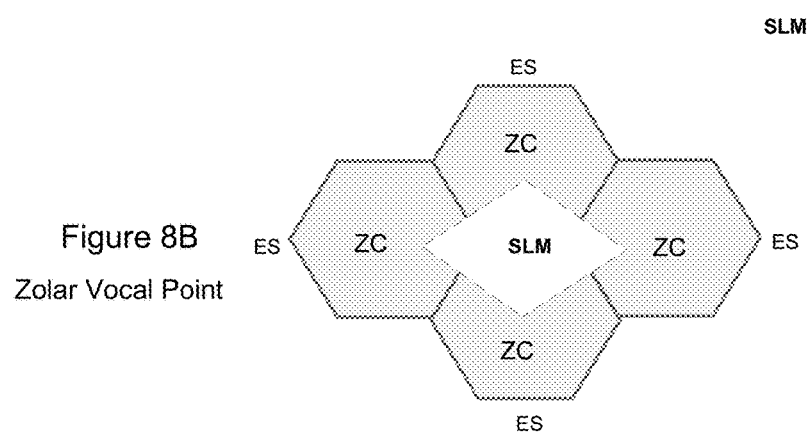
FIG. 8B depicts a Zolar Vocal Point (ZVP) configured on subsequent chambers allowing a controlled or determined amount of natural or artificial light rays to pass to one or more subsequent sub-chambers.

FIG. 8B depicts a configured Zolar Vocal Point (ZVP), where the configured zolar arrangements on primary or subsequent chambers are configured with one or more SLM's allowing natural or artificial light rays to pass beyond subsequent chambered layers; wherein the sub-chambers below are configured with a plurality of light-emitting devices—LEZ-light fixtures, providing artificial light absorbed by an arrangement of zolar-cells or zolar-cell modules within one or more chambered matrix's.

Considering the propagational directional change induced by waves exhibiting reflection and refraction properties; wherein the movement from one medium into another medium determines the refraction or refracting positional point indicating positions placement of the plurality of the zolar-cells or zolar-cell module on the undersides and below Photovoltaic Cluster Matrix Array Chambered layers, as light rays passing through glass, a thin film made of plastic, synthetic composites, or of additional elements or substances not listed, there are light wave variations of in a electromagnetic field in the propagation of light that reflects back into the original medium increasing the absorption rate and watts generated.

Thus, managed zolar rays manipulated collect these phase change light rays with configured constraints; wherein such light collimated passes through a modified surface medium, the surface area resembles a configured patterned prismatic rippled outward or inward depressions; wherein forced light wave bands are moved (forced) onto subsequent chambers, instead of reflecting back into the original medium. Now then, initially light waves that do not pass through the surface material and bends, occurring right at the interface (boundary) of air-to-glass (the surface substrate material), this refraction causes heat on surface, as in when light accumulates on a mirrors surface reducing efficiency on conventional panel system. The outward perpendicular bends in light band lengths are controlled with surface configurations, especially considering as the maximum incident angle gets larger, the transmitted beam would not be able to bend out further on lower index medium (air or glass), or of additional elements, compounds, substances or combinations therefor not listed may bend more or less than 90 degrees unless manipulated; wherein composite flexible zolar-film (ZF) substrate material on underside of primary or surface area on subsequent chambers may further manipulate by mirrors the incident angles on bands as they move beyond primary chambered layer and subsequent chambered layers.

Wherein, sub-chambers below primary and those subsequent chambers collects refracted light bands from configured positional placements of the plurality of the zolar-cell or zolar-cell modules arrangements within arrays expressly targeted location at a plurality of ZVP's, SLM's or LEIR's matched with configured spatial openings on primary chambered layers or level in a plurality of shapes or positional sizes including on or within or level in a functions as control mechanism managing light band passage; wherein ZVP's successfully collect cooled light rays from outer surface area or one or more configured inner LEZ's below or above the primary or the inner chamber on zLampShades. Further, when controlled light rays pass through additional or subsequent layers, the zolar rays angle continues to move in a similar opposing direction; therefor the sub-chambers must be configured proportionally aligned intensifying light energy generation, not only on zLamps, Zolar-Light fixtures, zLamp-shades, Zolar-Shingles including on zPanels.

[T]o understand the apparatuses concept further, the Iraqi born scientist, Al Hazem unexpectedly became aware in his course of research around 900 AD; wherein light passed (traveled) from air into an air-glass structure, parts of the light spectrum was reflected, more importantly light rays transmitted were sharply bent as it entered from air into a glass medium; wherein the further quantified that the light rays reflects from the interface (glass) in a similar manner as a ball striking a wall is 'reflected'. Each light bands are similar to one or more ball strikes, angular incident itself is perpendicular. Refracted or reflective rays of light bend angularly depending on speed and light ratio in a zolar arrangement and may be better than that of traditional solar panels compared with a plurality of chambered transmission medium to that in the subsequent chambered layers incident medium increasing watt generation; wherein forcibly navigating bands through controlled spaces on entry of each subsequent chamber layers. Further maneuvering bands with or without mirrors to be either redirected towards underside of primary collected from configured zolar-cells or zolar-cell modules, or bouncing or refracted upward at angular degrees, to control the redirecting of additional light rays to be absorbed by one or more subsequent sub-chambered zolar arrangements; and further adjusting zolar-cell or zolar-cell modules sizes proportionally on primary and subsequent sub-chambers increases zolar devices light energy generation absorption capabilities. Hence, the greater the ratio, the larger the bending angle. So, for example in reverse, directing light bands through water or a liquid matter surface area, it would refract through interface and then though air in the same way as it would when it goes from air-to-glass-to-water, angular change is dependent on thickness unless controlled, the property is called solar reciprocity. At both interfaces, however, it reflects according to the law of reflection: angle of incidence equals angle of reflection; wherein total quantity light bending represents the index of refraction. Accordingly, when light rays (bands) travel from glass to water it bends the opposite way, or of different directions dependent on additional material or substances light rays pass through that are not listed, therefore the amount of bending is determined by what is called the index of refraction; wherein controlling the refraction medium and the placement of the SLM's, LEIR's, ZVP's and the corresponding plurality of the zolar-cells or zolar-cell modules increases watt generation; wherein light bands (rays) and associated heat reduction are somewhat proportional as to increasing the modified absorption rates; wherein not only the primary, but each subsequent chamber is mathematically dimensional based on primary substrate material and the attached zolar-cell or zolar-cell modules arrangement on primary chamber layer surface and their corresponding zolar-cells or zolar-cell modules underneath, followed by the air-to-glass gap thickness/distance or glass-to-air chamber gap or vis-à-vis with liquid matter, e.g. glycol, are, water, or additional matter not listed, along with each subsequent sub-chamber's reverse side configured within.

Wherein, further adjusting the configuration of prismatic rippled outward depressions or of patterned shapes no listed configured in conjunction in differing patterns on not only primary substrate chamber surface, each subsequent chamber surface and respected back or underside can be further configurable to capture most if not all remaining bands from configuring surfaces a plurality of patterns of the plurality of the zolar-cell or zolar-cell modules arrangements entering primary surface and those subsequent chambers thereafter, whether the primary surface is next to, as in above and or below LEZ's on Zolar-Light fixtures, zLamp-shades and zLamp, Zolar-Shingles or outer edge of zPanels.

Initially, the magnitude of the reflection varies, depending on the nature of the two media as well as the angle of incidence of the approaching light. Secondly, a phase change takes place, the wave may or may not change as it is reflected from the surface area, however manipulating the surface substrate provides the ability to control (manage) reflective and refractive light waves characteristics; wherein light waves traveling from a lower index material into a higher index medium, the reflected wave changes phase and 'inverts 'at a plurality of angular shifts on subsequent layers and absorption rates decrease if not attended to by positioning a plurality of the SLM's, LEIR's, ZVP's and corresponding plurality of the zolar-cell or zolar-cell modules on the underside of primary substrate material covering same with a clear flexible film, a thin layer of glass, or a plurality of protective material matter.

Light moving in a specific direction from a higher index material into a lower one, as, for example, from water to air, it bends outward in a perpendicular angular directional movement more or less is dependent on index material matter being passed through of the thickness is relative; wherein zolar rays that are partially reflected off a surfaces interface, is not controlled or manipulated increases heat. The larger the angle of incidence, the more it will bend angularly, thus the counter refraction as in the surface configurations in conjunction with mirrors, SLM's (Subsequent Level Matrix Portal) or LEIR's around the Zolar Vocal Points, zolar-cells or zolar-cell modules and their associated blended interests further increase light energy generation capacity. Again the angular bend the beam can bend outward in lower or subsequent index mediums is only 90 degrees plus or minus a few degrees, hence assisting in computational configurations in the placement in positions of the plurality of zolar-cell or zolar-cell modules, mirrors, SLM's, LEIR's and ZVP's on each chambered layer. As the incident angle gets larger, the transmitted light beams would not be able to bend out much further. Thus, the use of prismatic outward depressed patterns on the outer surface area material for Zolar-Light fixtures, zLamp-shades, Zolar-Shingles, ZLamps and zPanels; wherein the flow of the outward patterns change their angles on one or more configured X,Y axis; each directional shift in a pattern determines the position of the zolar-cells or zolar-cell modules within the matrix below the pattern shift sub-chambers surface substrate. Furthermore, patterns may be etched, inscribed, formed, or of additional methods not listed into the surface area, including those of varying shapes, e.g. concavex, etc. The desired state within the apparatuses applications further include at least one comprehensive mirror array that may be made of polished or not aluminum or of additional materials or element not listed designed to reflect zolar light rays; wherein such matter is further sealed with a clear protective reflective coating; wherein the UV-Strengthened mirrored substance is shielded by a UV layered application, prolonging system chambers life, damage and possible deterioration of array's reflectivity. Various applications may require extremely low thermal expansion application or to increase reflectance capabilities; wherein protection options needs are suited for certain environmental configurations, e.g. external elements or for interior usage, mainly since bare aluminum is extremely delicate and susceptible to damage.

Determining the index of refraction assist with configured computations for constructional shape of primary chambers one or more matrix inter-connected with one or more arrays, further connected to one or more zolar-cells or zolar-cell modules outer surface in relationship to each subsequent collection chamber; wherein primary substrate materials whether glass, air or of additional elements of materials no listed combinations thereof or composite components, each calculated layers determined index of refraction further determines construct arrangement along with sub-chambers assembled character in pointed harmony with each sub-chamber clusters within their associated matrix's. By knowing and computing the corresponding critical angle as a wave of light enters or exits a particular material, resulting calculations decreases total internal reflection on any field of light entering by manipulating the lights travel with configured spatial passage in conjunction with controlled surface diffraction areas in a unique determined directional flow, forcing angular wave transmission into sub-chambers and the bounce back into previous chambers underside increasing electric field absorption, prevents or eliminates heat loads from configured zolar-cells or zolar-cell modules on primary and of subsequent chambered layers; wherein this controlled angular forcing is continued on sub-chambers increasing or decreasing depending on matter entered or exited the spatial distances between plurality of the zolar-cells or zolar-cell modules configurations by increasing zolar-cell or zolar-cell modules collection size, along with mirrors, SLM's, LEIR's, and ZVP's on each subsequent chamber as the light and their associated molecules are further cooled.

Figure 9:
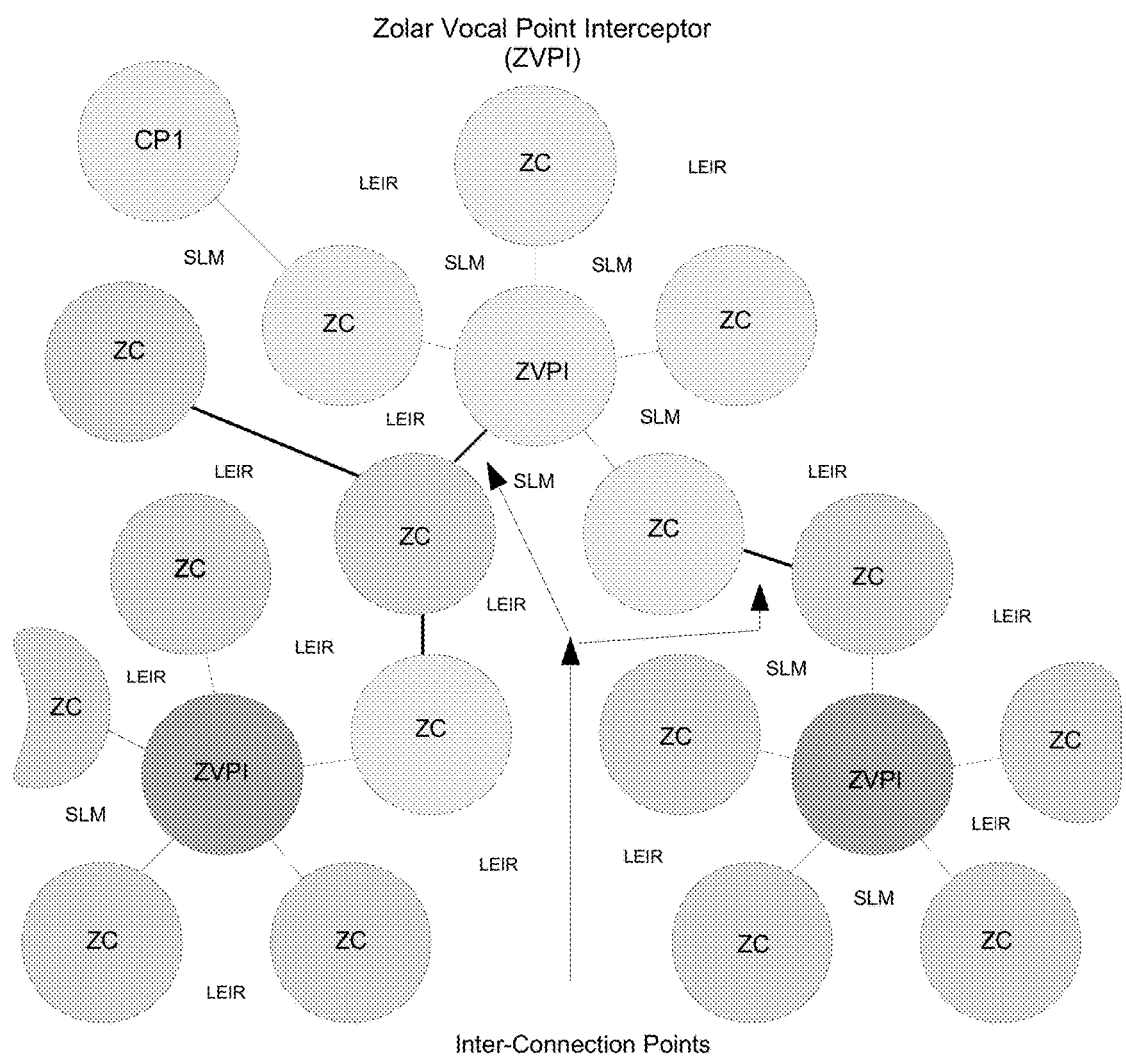
FIG. 9 provides an example view of Zolar Vocal Point configurations in a subsequent chamber inter-connected arrangement controlling light to pass through one chambered layer to next chamber layer by the positioning a plurality of Subsequent Level Matrix Portals within an array, cluster of arrays concentrated within a quadrant area of a matrix field.

FIG. 9 representing an pentagon shaped Interconnected Cluster Matrix Array Subsequent Chamber configuration; wherein each configured Zolar Vocal Point Interceptor (ZVPI), comprises at least three or more dependent on chambered layer of the plurality of zolar-cell or zolar-cell modules inter-connected within an array; wherein one or more arrays are inter-connected within a cluster; wherein at least one or more clusters are spatially determined in concentrated arrangements within a matrix or a quadrant field or area. Each matrix's on primary or subsequent chambers are proportionally configured based one or more factors, e.g. geographical deployment location, the number of chambered layers, whether panel system surface is mounted on a wall or ceiling or configured as a flat panel matrix arrangement in need of protection from weather elements or not or of additional constraints not listed.

Each ZC is configured on outer circumference sides; wherein the outer surface plane is higher by at one or more centimeters and or millimeters than inner circumference side for each ZVPI; wherein the angle is computed in reference to above chambers outer surface thickness and material type, or of additional constraints not listed. The CP1 marked cell notates a connection point with an adjoining cluster; wherein ZSC determines which matrix's light energy generated power combined with at least one other matrix area or field within a cluster of a plurality of arrays combined watt power generate are to be gated to battery-charging system, charging port, at least one LEZ on the LEZ-light-fixture or at least one LEZ-light-fixture; wherein merged power is calculated to be consumed by internal at least one LEZ-light fixture, gate to reserve power or externally charging smart devices.

Such informational data generated from zolar formations are inclusive as to light energy generating capabilities for each zolar-cell; wherein tracked data within each cluster and their associated arrays within each matrix system diagnostic analytical parameters on: production, consumption, life expectancy parameters; wherein light energy power generated within is calculated and configured to be gate directed back to one or more of the light-emitting ziodes (LEZ's) configured on the LEZ-light fixture, within arrays, a cluster or a zone or a quadrant within matrix area; wherein ZSC instructs the battery-charging system controller to gate watt power to the external charging port based on light apparatuses functional combined watt output. Furthermore, the informational data collected enhances the overall performance as to light structured apparatuses intricate consumption, production variables and life expectancy of a LEZ-light device or component part or parts including the plurality of zolar-cell or zolar-cell modules within on a Zolar-Light fixtures, zLamp-shades, zPanels or zLamps, further displayed on systems configured LED's or transmitted wirelessly to at least one receiving station; owner, manger or a user.

A further embodiment on entire system capabilities, each of the inner outer surface area of figures five (5) and six (6) or for plurality of nano Inter-Connected Cluster Matrix Array Chambered Configuration of one or more layers on zLamp-Shades and Zolar Panel systems, may be equipped with a plurality of light-emitting ziodes on at least one LEZ-light fixture, or mounted on the underside of primary chamber configured to project decorative, emblematic or heraldic designed image(s) or to indicate functional system attributes displayed on outer surface area, e.g. system OK, one or more areas within a specific quadrant, or by at one LEZ on outer surface structure.

It is a known fact, when light energy or packets (rays) and the associated number of times the atoms bounce off one another or objects causing the atoms to be redirected multiple times; and heat itself increases in similar proportions. Thus, the preferred embodiment for a sustainable light energy generating system allows light energy photons to pass through unrestricted towards one or more layered chambers, each transitional layer collects those light energy atoms that the previous chamber configuration provides passage by way of configured SLM's or LEIR's from primary onto subsequent layers from wavelengths not being absorbed or captured on primary or subsequent chambers. The sustainable light energy generating systems features increases absorption and energy conversion efficiency; wherein one or more layers maybe suspended in a clear semi or non-conductive transparent matter, e.g. gas, liquid, or of additional matter not listed and inter-connected in a connective manner with fixture housing, structure or container; instead of being attached thereto one or more zolar-film chambered layers independent of subsequent chambered layers that are interconnected in a group of one or more chambered layered panel zolar systems. Hence, for those craftsmen having the knowledge in the craft understand, light energy mass of artificial or natural light rays approaching a photo-zolectric configuration contemplated within the apparatus combinations are of at least one zolar-cell in proportional suspension either in matter or on zolar-film attached thereto, distances between clustered matrix arrays allows the illumination and configurable image projections, collecting light energy transmitted in a particular direction through at least one subsequent layered medium and the benefits thereof increase the capture or absorption rates and watt generation from light energy being collected in zPanels, zLamps, zLamp-fixtures, Zolar-Shingles or zLamp-shades. Wherein the spectrum of certain wavelength light ray atoms are collected; including those not collected, continue on pass through a cooling chamber entering subsequent chambered collection points (ZVP), of which charged controlled rays within fields or areas configured trajectory aimed at one or more ZVP's interconnected within at least one quadrant or matrix on additional chambers carry on zolar systems light spectrum gathering or absorption. Wherein the sustainable light energy generation system configuration is further enhanced by outer surface layer disposed of a thin transparent film comprised of one or more configure convex, concave or concavex shaped imaging pattern of nano lenses with spacial configured distance between patterned areas providing a managed conduit for certain type or parts of light energy spectrum gated further to existing sub-chambers; wherein zLamp-Shade chambers outer surfaces are stamped or embossed with aforementioned preferred lens configurations; wherein optical zolar rays are further controlled or gate directed towards specified fields of zolar-cells or zolar-cell modules within proportional configured matrix arrays, including subsequent chambered layers, creating a Quantum Light Energy Generation System combined with the embodiments herein presented.

Furthermore, each matrix on primary level is configured based on over-all surface size and shape; wherein the center point axis on a panel flat or curvature of a plurality of shapes arranged vertically or horizontally or even multi planed as in one plane in a perpendicular position with another surface plane; wherein the center area or X,Y axis intercept—0,0 determination can be further manipulated as in 0,0 is not the true measured center of a specific enclosure or housing device panel or the side of a non-rounded zLampshade or a rounded lamp shade. Once center point determination is chosen, the mapped zone fields for each quadrant or matrix is computed; wherein not only the ZVPI is calculated, each ZC is independently identified with a specific coordinate loaded into ZSC in a plurality of mediums built or formed of solid state or nano technology, or of additional technologies not listed. A further pre-configured embodiment, consider we take a lamp shade cover no matter whether the outer surface is either rounded or angular shaped require a plurality of support structures, either vertically or horizontally and reduce surface areas into quadrants, known a Quadrant Surface Identification (QSI). Wherein each arrays coordinates are further isolated initially stating a positional location in a cluster or a quadrant using either numbers or alphabetic indexes or combinations thereof, followed by X,Y coordinates for each zolar-cell or zolar-cell modules and each LEZ on the LEZ-light fixtures, comprised of at least one cluster within at least one array that further encompasses at least one zolar-cell entirely positioned within a matrix area or field. Finally all zolar-cells or zolar-cell modules within arrays are assigned to clusters positioned within a matrix. Wherein the process isolates each positional location within an array, cluster, quadrant or matrix field of the plurality of the zolar-cells or zolar-cell modules, LEZ's on the LEZ-light fixture, sensors and decives precise location, providing a pin-point data location being received by ZSC calculating performance indicators; wherein zolar system indicators or attributes are communicated externally, via a wi-fi data link to one or more receiving stations or a single device a PC, MAC or a smart device displaying all informational data analytics system generated by self monitoring.

The above embodiments assists flat zPanels, zLamp-Shades, zLamp-fixture, zLamps, or Zolar-Shingles the production of and life expectancy, deterioration rate or rates, and zolar system attributes, that are further dissected into smaller zones relative to length vs. the width of each zolar panel; wherein zolar panels have at least four quadrants, primary chamber nomenclature consists of Q, the next subsequent chamber Q2; the next chamber Q3 and so on; wherein each quadrant field or area comprise a unique identification or a QUID (Quadrant Identifier 'Q'), plus the associated X,Y coordinates representing m-center for each lamp shade angled side surface or a zolar panel and it location of each zolar-cell or zolar-cell modules, there positional placement in an array, a cluster or a quadrant section; wherein reference start point is marked on upper rim edge and beginning count is either clockwise or counter clockwise. For instance a hexagon configured lamp shade, e.g. a pentagon 5 sides; wherein upper and lower rim is an angular circular fashion reflecting the same pattern as the number of quadrant sides, with each chamber the vertical supports may be built or formed in an angular outward or inward fashion or in both directions creating flat areas in a curvature nature, or of additional angular shapes not listed.

Currently traditional solar cell or panel configurations are unable to self monitor individual cell output, record individual total watt generated with a solar cell or defined area within panel; further unable to log quadrant or sectional power generation of each solar panel or provide information as to specific declining deficiency, watt generated of a particular cell and or given area or a light fixture; informing a manager, owner or for that matter a consumer is not able to be informed on all solar system variables; wherein embodiments herein for each Photo-zolectric devices ZSC is fully conscious of the zolar system status by self monitoring itself, providing diagnostic analytics and self healing from redundant inter-connection points between LEZ's and the plurality of zolar-cells or zolar-cell modules and sensors within each sustainable light energy generating system apparatus, in the event damage to connections with Zolar-Light fixtures, zLamp-shades, zPanels, Zolar-Shingles or zLamps, from connections for both communications purposes and transmission of power between zolar-cells or zolar-cell modules in arrays within clusters and their associated zoned matrix's communicating with the ZSC, wherein one or more of the embodiments listed herein are used and are incorporated in conventional solar panel systems.

Wherein on zLampshades lamp shades vertical supports are made from wire, plastic, composites or of additional materials or substances not listed to separate the entire circumference of the lamp shade into slightly horizontally curved plains comprised of at least of six quadrants displayed similar to: Q1, Q2, . . . up to Q6 for a hexagon shape; wherein a pentagon has five quadrants, circular lamp shade are an imaginary X,Y coordinate system Q1-Q4, with divisional areas marked on upper or lower rim areas. Wherein a specific zolar-cell or zolar-cell modules location within 'Primary Chamber Quadrant' (Q1) interprets similar to QZ5—Quadrant Zone 5, QA2/6—Quadrant Array two (2) of six (6) arrays, configured within QC4/4—Quadrant Cluster Four (4) of Four (4) Clusters, inter-connected in QM6/3 Quadrant Matrix Six (6) of three (3) Matrix areas or fields, on to the sixth quadrant layer Q6; wherein their are 5 zolar-cells or zolar-cell modules locations relative to this arrays zone m-center example is: {X axis 11, Y axis (16)} that can be further reduced as X11Y(16); wherein the configured position equates to the $2^{nd}$ array of six, within the $4^{th}$ cluster of 4, within the $6^{th}$ matrix of two more in quadrant 6. Breaking down the nomenclature further, there are 5 zolar-cells or zolar-cell modules in this one particular array of which there are six total arrays, each has zolar-cell or zolar-cell modules has their own X,Y axis determined by arrays m-center. Wherein the naming nomenclature for braces indicate a negative field or number similar to accounting or banking value notation, for clarity removing the computational execution processes (negative sign) from the processing equation when production vs. consumption of a selected or ZSC determined array within one or more clusters regarding performance calculations are performed by Zolar System Controller (ZSC), and for the purpose of indicators of an array, a cluster failure exists or the entire quadrant or matrix's watt production is deteriorating at what percentage.

Wherein additional unique identifiers for nomenclatures indicating the locations for mapping locational positions coded in the ZSC are determined based on Zolar-Light fixtures, zLamp-shades, zLamps, Zolar-Shingles or zPanels constructional attributes necessary to identify each zolar-cell or zolar-cell modules within at least one array, and positions in at least one cluster each layered inter-connected within at least one quadrant layer or a matrix area field. Meaning, if there are two chambers, the matched correlated sub-chamber or subsequent configured chamber quadrant nomenclature is QMS1, the 'S' stands for subsequent followed by a numerical number for each additional chamber. Each zolar-cell or zolar-cell module is assigned a QUZID (Quadrant Zone Identifier—for a specific zolar-cell or zolar-cell module within an array, configured identification may be in a spiral fashion starting at center mass for each zolar-cell or zolar-cell module within an array), each array is assigned a QAZID (Quadrant Array Zone Identifier) within each cluster there is at least one array wherein each cluster is assigned a QCZID (Quadrant Cluster Zone Identifier)—identifies a specific cluster within an assigned matrix. Wherein clustered arrays has a similar X,Y number for the purpose of computations representing the production figures from a particular array zone within the primary clustered zone; wherein such data is transmitted to ZSC from each matrix and its associated clustered arrays for a specific zolar-cell or zolar-cell module as to its combined production output in a selected or ZSC determined array within at least one cluster, displayed as QMZID; wherein when ZSC combines one or more clusters with at least one additional arrays or clusters with clusters from additional arrays within a different quadrant or matrix area field and further combing one or more of each with an additional matrix area or field, the mapping of each zolar-cell or zolar-cells module within an area or field for the purpose of gating or combining power, including tracking the production, deterioration of each zolar-cell or zolar-cell modules becomes simplistic. Each of the confirmed nomenclatures or unique identifiers can be further coded and reduced, example: QZ, QA, QC and QM each followed with their own coordinates. Wherein the assigned QUID is found within each center mass (mcenter axis intercept) or a selected area or field, the mass center of an array of zolar-cells or zolar-cell modules each having their own X,Y axis, the mcenter of each clustered array and finally the mcenter of each matrix within a quadrant notating each coordinate position thereof. Wherein further identification is determined clockwise or counterclockwise in a spiral downward manner on zLamps, Zolar-Light fixtures, Zolar-Shingles, Zpanels and zLamp-shades left to right initial start would be upper left quadrant of m-center on zPanels plane surface area; wherein uniformity is necessary in formulation for programming processing fields. Finally, the preferred embodiment for calculating the precise locations of each zolar-cells or zolar-cell modules within at least one zone array arrangement within at least one clustered zone configured within at least one or more matrix's is the conversion of each unique coordinate nomenclatures expression is converted to a binary numerical, or a binary notation for gate mapping identified locational of devices, components or sensors, performing a plurality of computational processes for at least one or more zolar-cell or zolar-cell modules in each array, cluster and matrix's positional identification of a watt generated, a deterioration rate, gating power distribution, total watt generated, or other procedures and processes not listed. Creating another embodiment, wherein ZSC determines a zone, area or field of the plurality of the zolar-cells or zolar-cell modules within arrays connected to clusters within a quadrant of one or more matrix's that may have reached their end-of-life cycle, ZSC creating a lockout, ignoring further signal communication thereafter.

Another preferred embodiment for canister type zPanels of a plurality of shapes and or sizes; wherein the entire circumference, including the underside of a dome or curved area and inside edges of canister the plurality of zolar-cells or zolar-cell modules positions are indicated by QSI nomenclature; wherein quadrants are easily monitored and controlled as to directing power from center mass alignment to a plurality of light-emitting Ziodes on the LEZ-light fixture and the battery-battery system separately or both gating power to LEZ-light fixture and battery-battery system mounted on inside of a canister.

Wherein the Inter-connectivity of the zolar-cell or zolar-cell modules coded within ZSC provides real-time data analytics for zLamp, zLamp-fixture, Zolar-Shingles, zLamp-shades or zPanels and the photo-zolectric configuration with the ability to self monitor, therein providing the ZSC information to calculate essential elements providing real-time data from a plurality of designed zolar light structure apparatuses, including intricate length of life and performance attributes, that efficiently and effectively manages system variables for the production of light energy generation. Thus, the principal of tracking identified sections and the zolar-cell or zolar-cell module within a zolar arrangement and their localized devices within, allows the system to be conscious of and provide real-time elements as to its efficiency level, the systems life-span, intricate deterioration factors, terminate communication with certain areas and directionally gate power in multiple directions; herein modifications within the embodied nomenclature can vary in accordance with a preferred standardization, driven by anticipated consumer cost acceptance and performance needs. Wherein ZSC is equipped with wireless communication links (com-links) a plurality of sensors: at least one temperature, humidity, angle of sun sensor to self monitor an move at least one screw shank aligning zPanel for highest output, wind speed, corrosion, vibration sensor below frame, on primary surface area and at least one on side for Zolar-Light fixtures, zLamp-shades, zLamps or zPanels, ZSC transmits analytics to a web-based application or smart devices; wherein system uses one or more RSS feed (Really Simple Syndicate, a common communication method used on the Internet) or XML (eXtensible Markup Language) or additional convenient communication messaging system procedures; wherein viewable data messages and performance data are viewable with code written from XHTML, HTML5, XML, XSLT or current none modifiable display code. Wherein, diagnostic analytics itself, evolves from historical computing from program or routine that helps a user or quantum system to identify weaknesses, limitations of or to, errors within the application and codes within the one or more subroutines or processes, loose connections, corrosion from dissimilar metals, vibration, thermal cycling, expansion and infinite mortality of each cell within an arrangement of at least one arrayed cluster inter-connected to at least one zoned matrix with and to each part within system apparatuses associated properties; wherein the light energy generation system becomes infinitely smarter. Another embodied deficiency with current panel arrays, each panel within the arrays field move in unison in the directional point system initiates; wherein each photo-zolectric system is equipped with at least one programed solar radiation sensor (SRS) device communicating instructions or data detected to ZSC, executing at least one screw shank device mounted on at least one location to move at least one screw shank on zpanel towards the highest calculated reflectance point-aimed each zlamp independent of one another, increasing light energy generation in fields array, adjusting at least one screw shank just a few degrees of arc-angle change.

Figure 10:
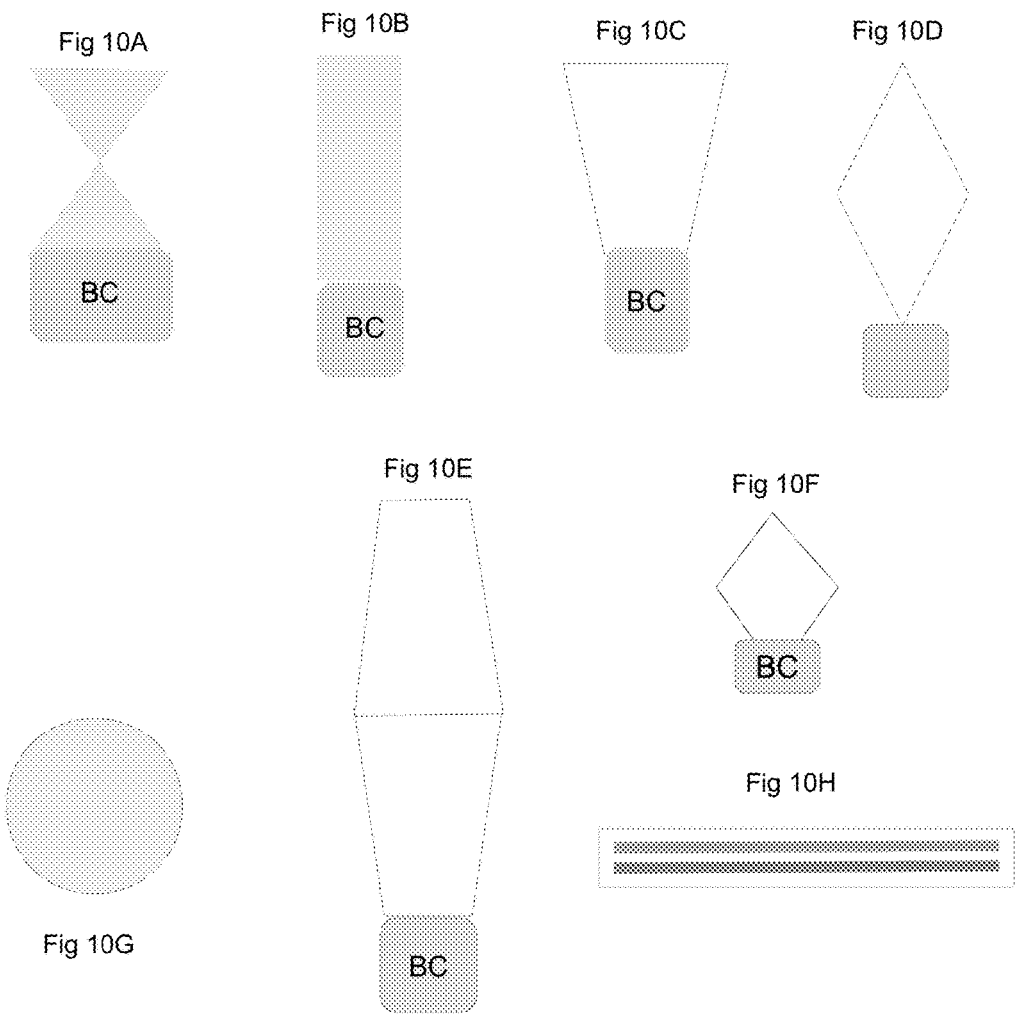
FIGS. 10A-10F displays plurality of configurations of LEZ-light fixtures.

FIGS. 10A through 10H provides a representation of just a few configured LEZ-light fixture devices; wherein FIG. 10A is configured to illuminate a confined surface area; wherein an arrangement of zolar-cells or zolar cell modules collecting artificial light ray bands; wherein changing the center area outward and stacking a column or cylinder shape configured with LEZ's illuminates a larger surface area collected by additional zolar-cells or zolar-cell modules. FIGS. 10B through 10F are further examples of configured zolar-cells or zolar-cell modules, proportionate to light passing outward illuminating surrounding area and further allowing natural light to be absorbed on primary chamber and subsequent chambered layers, where certain or parts of the light spectrum and of rays are deflected back up to underside of the primary level and sub-chambers surface being absorbed further on subsequent chambered layers; wherein additional light rays pass onward to subsequent layers and again there are band light rays that are further directed on underside of secondary, remaining light rays continuing on to next layer or layers by a controlled absorption process. Each zLamp configuration encompasses at least one LEZ device; wherein device is built or formed in a proportional relationship to or with each zolar-cell or zolar-cell modules attached to a Zolar-Light fixtures, zLamp-Shades or zLamps. Each zLamp fixture provides a matched set in particular formations of at least one LEZ device; wherein depending on Zolar-Light fixtures, zLamp-shades, zLamps or zPanels outer surface area and its conformed inner surface areas, a combined group of LEZ configurations are computer built or formed based on power ratio needed to sustain LEZ system with sufficient power; wherein generated energy is balanced to at least one LEZ, battery-charging system or charging port simultaneous; wherein the load balance between battery-charging system controller or the charging port may be greater or less based on system variations as to over all production of watt volume. During daylight hours system is charging battery-battery system, in the evenings ZSC determines in advance with notification displays, on or more quadrants may only be used to produce instead of consume on both inner and outer of the arrangements on primary or on subsequent chambers in one or more chambered layers if charging port is activated.

FIG. 10G provides simple illustration of a round fixed canister type zlamp; wherein LEZ's are configured on top and bottom side of round flat surface area; wherein the underside LEZ's generate artificial light-emitting rays captured by one or more zolar-cells or zolar-cell modules in a concentrated configuration; wherein outer side LEZ's provide illumination to surrounding areas or projecting images in one or more directions and projecting at least one image.

FIG. 10H shows a tubular LEZ device; wherein over the past few years we've seen the replacements of florescent tube bulbs with LED bulbs; tubular LEZ's have a battery-charging system controller mounted below or above inside canister housing; wherein entire length of LEZ-light fixtures tubes entire circumference are configured LEZ's of at least one LEZ tube bulb mounted on zPanels canister of a plurality of shapes or sizes covered with a transparent or translucent material; wherein the configured zolar system apparatus provides sufficient light energy generation not only to maintain batteries by the battery-charging system controller, excess light bands further refracted by a plurality of one or more shaped mirrors assist primary side for the illumination of surrounding areas, enhancing LEZ's on top side or bottom if mounted on ceiling; wherein the ZSC turns off or deactivates one or more LEZ's in the LEZ-light fixture based on user preferences or rheostat settings controller by ZSC to increase or decrease illumination or vis-à-vis to a plurality of LEZ'S above LEZ-light fixture, if the battery-charging system is nearing full charge, or needs charging based on one or more ZSC messages received from battery-charging system controller; wherein the LEZ-light fixtures include LEZ's in a plurality of colors, shapes, sizes.

Figure 11:
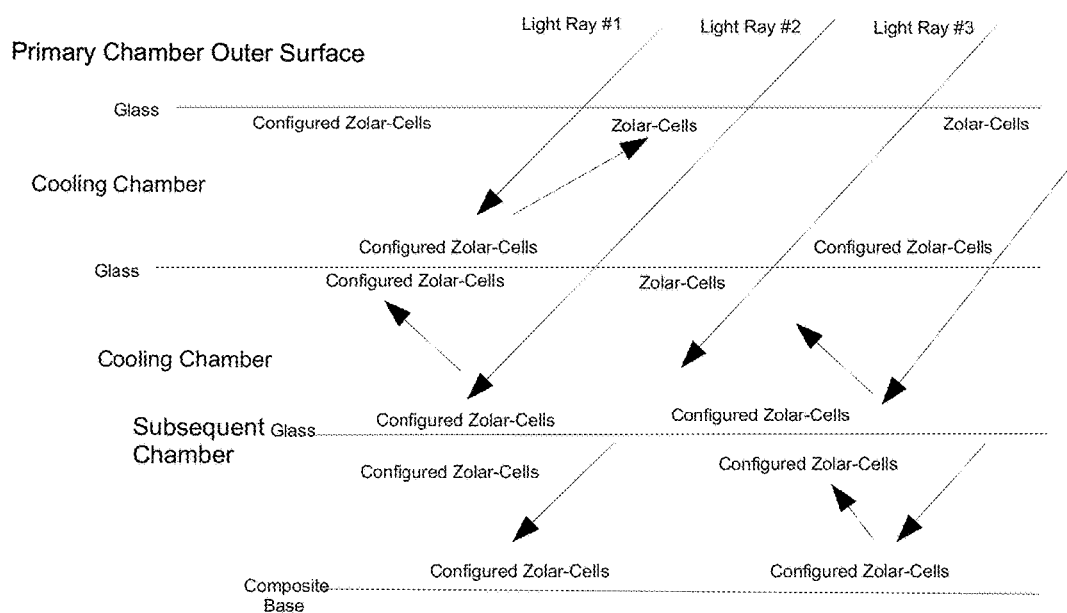
FIG. 11 demonstrates angular zolar-cell or zolar-cell modules placement, determined by subsequent chambers reflectance properties.

FIG. 11 portrays and is merely illustrative of a configured zolar-cells or zolar-cell modules incidence placement determining one or more zolar-cell or zolar-cell modules reflection positional points on primary substrate an below or on underside of primary substrate and subsequent layers that resemble without being identical or exact in the geometrical configurations; wherein the Iraqi born scientist, Al Hazem's discovered discipline; wherein light rays bounce like a ball of a wall and their reflective properties act according to the law of reflection: angle of incidence equals angle of reflection; wherein the sustainable light energy generation system apparatus incorporates Hazem's theory in its entirety, along with current advancements in and of similar theories of transmission of the light spectrum waves including visible or non visible light rays against resonant properties of absorption over reflection positions; wherein creation of an algorithmic calculated data base on absorption variable frequencies in the position of and placement for each zolar-cells or zolar-cell modules and their assimilated arrangements determines said positions, since light usually has multiple frequencies the sum of forms the resultant wave. Different frequencies undergo different angles of refraction, a phenomenon known as dispersion, the resulted calculated angle supports energy collection for zPanels, zPanel fixtures, zLamps and zLamp-Shades within arrays concentrated in clusters attached to one or more zoned matrix's in correlated agreement with at least on LEZ generating self sustaining power.

Wherein the above embodiment is tested and verified by, projecting bands of light rays from at least one array of a plurality of LEZ configurations or a plurality of LEZ-light-emitting devices aimed at center mass of a plurality of flat or curved substrate materials and at deferring angles, surrounded by a round enclosure, or on flat surface area below substrate material attached thereto a plurality of light sensors; wherein angle of refraction and their associated dispersion is compiled in a computer program calculated from a plurality substrate materials; wherein this same event is accomplished using a computer-implemented software program, verifying precise placement within each arranged LEZ and its associated zolar-cell or zolar-cell module for zLamp-Shades, and on zLamp-fixtures, zLamp and zPanels constraints and functional layout are precise by design, displayed on a visual screen comparing overlay of each computing positional arrangement each chamber layer and position of the plurality of zolar-cells or zolar-cell modules in an areas field.

Furthermore, the paradigm disclosures, solutions, methods, configured apparatuses and embodiments disclosed or described herein may be implemented in conjunction with one another or independently from one another, depending on the specific embodiment and implementation of a energy collection systems equipment from organized disciplines and collective components herein. Accordingly, the presence or absence of additional subject matter that may be complementary to the sustainable light energy generation system apparatus in no way limits the scope of the present method and system apparatus from proficient craftsmen and its future contemplations thereof, to generate sustainable light-emitting energy from various contemplations described herein.

Clearly; without doubt, there are many additional modifications and variations within the sustainable light energy generations system apparatuses breadth are possible in light of the above teachings. The specific embodiments discussed herein, and/or certain nomenclatures used to reveal unique processes and procedures to illuminate conceptualization; wherein embodiments became known simply through elaborations or illustrations in the overall explanation as time is of the essence in the thought amount to be as centered as possible, and are not meant to limit the scope of the present embodiments in the sustainable light energy generation system apparatus. It is therefore to be understood that within the scope of the disclosed light energy generation systems methodology, the sustainable light energy generation system apparatus may be practiced otherwise then as specifically described without departing from the soul and depth of the delineated embodiments characterized herein.

Furthermore, the plurality of the photo-zolectric/photoziode, LEZ-light-emitting solutions for collecting energy, processes, methods, devices and embodiments disclosed or described herein may be implemented in conjunction with one another or independently from one another, depending on the specific embodiments of light energy generation collection system. Accordingly, the presence or absence of subject matter that may be complementary to the present system, in no way limits the scope of the present method and its future contemplations thereof.

The embodiments have been presented for the purpose of illustration and description. It is not intended to be exhaustive or limit the apparatus to the precise form described, many modifications and variations are possible in light of the above teaching. The embodiments were chosen and described in order to best explain principles of the sustainable light energy generation system apparatus and its practical applications. These described embodiments enable proficiency in the art to utilize and practice the zolar apparatus with various combinational modifications therein, that are suited to a particular environmental use.

The invention claimed is:

1. A multi-layered photovoltaic panel system comprising:
   a primary interconnected-cluster photovoltaic matrix array panel comprising two primary chamber areas;
   a first air or liquid cooling chamber layer disposed on the primary interconnected-cluster photovoltaic array panel;
   a first flexible film overlaid on the primary interconnected-cluster photovoltaic matrix array panel and disposed between the primary interconnected-cluster photovoltaic matrix array panel;
   a second flexible film overlaid on the first air or liquid cooling chamber;
   a secondary interconnected-cluster photovoltaic matrix array panel comprising two secondary chamber areas disposed on the second flexible film;
   a third flexible film overlaid on the second interconnected-cluster photovoltaic matrix array panel;
   a second air or liquid cooling chamber disposed on the third flexible film;
   a fourth flexible film overlaid on the second air or liquid cooling chamber;
   a third interconnected-cluster photovoltaic matrix array panel disposed on the fourth flexible film;
   a fifth flexible film overlaid the third interconnected-cluster photovoltaic matrix array panel;
   wherein an external face of the primary interconnected-cluster photovoltaic matrix array panel defines a first outer surface of the system;
   wherein an external face of the fifth flexible film defines a second outer surface of the system; and
   wherein each of the first and second outer surface of the system is coated with a cooling agent.

2. A multi-layered photovoltaic chambered panel layer system comprising:
   a primary interconnected-cluster photovoltaic matrix array panel comprising two primary chamber areas;
   a first air or liquid cooling chamber layer disposed on the primary interconnected-cluster photovoltaic array panel;
   a first flexible film overlaid on the primary interconnected-cluster photovoltaic matrix array panel and disposed between the primary interconnected-cluster photovoltaic matrix array panel;
   a second flexible film overlaid on the first air or liquid cooling chamber;
   a secondary interconnected-cluster photovoltaic matrix array panel comprising two secondary chamber areas disposed on the second flexible film;
   a third flexible film overlaid on the second interconnected-cluster photovoltaic matrix array panel;
   a second air or liquid cooling chamber disposed on the third flexible film;
   a fourth flexible film overlaid on the second air or liquid cooling chamber;
   a third interconnected-cluster photovoltaic matrix array panel disposed on the fourth flexible film;
   a fifth flexible film overlaid the third interconnected-cluster photovoltaic matrix array panel;
   wherein an external face of the primary interconnected-cluster photovoltaic matrix array panel defines a first outer surface of the system;
   wherein an external face of the fifth flexible film defines a second outer surface of the system; and wherein each of the first and second outer surface of the system is coated with a cooling agent;
   wherein additional solar panel models are disposed with at least two primary chambers, two secondary chambers and two or more subsequent chambered layers;
   wherein each layer of the first through fifth flexible films is disposed with a plurality of clear calculated spaces disposed between a plurality of solar-cells and solar-cell modules;
   wherein the plurality of the solar-cells or the solar-cell modules are disposed in at least three or more clusters, each cluster having of at least three of the plurality of solar-cells or solar-cell modules, the plurality of solar-cells and the solar-cell modules are disposed in a plurality of patterns of the at least three clusters within each array, wherein at least one section is at least three clusters disposed within a quadrant section, where quadrants are at least four quadrant sections;
   wherein the solar-cells and the solar-cell modules are assigned unique identifiers within each of the clusters, the arrays, the quadrant sections or quadrants;
   wherein each of the solar-cells or solar-cell modules is built with at least four or more terminal connections;
   wherein at least one of the four or more terminal connections on each solar-cell or solar modules transmits watt generated to a solar system controller;

wherein the at least one terminal connection on each solar-cell or solar modules connects three or more of the solar-cells or solar-cell modules together within at least one of the clusters;

wherein the at least one terminal connection of the at least one solar-cell or solar-cell module connected within at least one of the clusters connect to at least one of the arrays, or two or more of the solar-cells or the solar-cell modules with one cluster connects to the arrays;

wherein two or more of the arrays are connected to form a section;

wherein at least four of the quadrant sections form a quadrant, or at least one section is divisionally sectioned into four or more sub sections within each of the quadrant sections.

3. The multi-layered photovoltaic chambered panel layer system of claim 2, further comprising:

a solar light fixture disposed of at least one primary layer of the multi-layered photovoltaic chambered panel system the interconnected-cluster photovoltaic matrix array panel, comprising:

at least two chamber panel layers, and other solar light fixture models are disposed with at least one secondary interconnected-cluster photovoltaic matrix array panel layer separated by an air or liquid cooling chamber layer disposed around the solar light fixtures inner structured housing;

wherein the primary interconnected-cluster photovoltaic matrix array panel comprises:

at least two layers of the multi-layered photovoltaic chambered panel layer system, the interconnected-cluster photovoltaic matrix array panel disposed on outside surface areas of solar light fixtures structure and disposed on inside of an enclosure or structures surface areas including sides;

wherein each of the solar light fixtures structure is disposed with a corresponding LED light fixture;

wherein the LED light fixtures disposed to transmit light within a light spectrum including visible and non-visible light rays comprise:

an LED light bulb designed disposed to be in unison with solar-cells and solar-cell modules disposed within the first or second multi-layered photovoltaic chambered panel system disposed on the underside of the solar light fixture;

a plurality of LED's disposed on the LED light fixture illuminating a surrounding area, or illuminating a selected or determined surrounding area by allowing light rays to pass through inner and outer chambers, or light rays from one or more LED's disposed on the LED light fixture to pass through a configured area within array, cluster or quadrants regions or areas;

the corresponding LED light fixture is verified by at least one computer software program positional formation of each LED of the corresponding LED light fixture in unison with one or more of the solar-cells or the solar-cells modules on the underside including side of the solar light fixture; and the corresponding LED light fixture is verified by field testing LED's positional formation, or placement on the corresponding LED on the light fixture is in simultaneous performance with a plurality of the solar-cells or the solar-cells modules within at least one array or a cluster;

wherein the corresponding LED light fixtures LED's illuminates the underside of each solar light fixture on the underside of housing in a determined field, and the solar light fixture structured enclosure simultaneously;

wherein one or more solar light fixture, or solar lamp shade models display a image or multiple images at the same time;

wherein at least one solar light fixture, or solar lamp shade model displays a name;

wherein one or more solar light fixture, or solar lamp shade models are disposed to illuminate determined an area or field, or to project at least one image, or both illuminate and project one or more images simultaneously;

wherein one or more solar light fixture, or solar lamp shade models are disposed to illuminate or display a logo image or multiple logo images, or both illuminate and project multiple logo images;

wherein solar light fixtures are disposed with at least one multi-layered photovoltaic chambered panel layer system of the interconnected-cluster photovoltaic matrix array panel comprising:

at least one multi-layered photovoltaic chambered panel layer system chambered layer of the interconnected-cluster photovoltaic matrix array panel disposed on all inner and outer surfaces of the solar light fixture housing or structure;

wherein other solar light fixture models are disposed with at least two or more of the multi- layered photovoltaic chambered panel layer systems;

wherein one or more solar light fixtures is one of:

a stationary solar light fixture mounted on a wall, ceiling or on a pole;

a mobile solar light fixture;

a solar light fixture disposed to be weather proof;

a solar light fixture disposed for indoor usage;

a fixed solar light fixture;

a street light fixture disposed with at least one multi-layered photovoltaic chambered panel layer system of the interconnected-cluster photovoltaic matrix array panel layer on outer surface area and on underside above and the surrounding areas around solar light fixtures LED light fixture;

a street light attached to at least one multi-layered photovoltaic chambered panel layer system of the interconnected-cluster photovoltaic matrix array panel layer;

a street light built with at least one multi-layered photovoltaic chambered panel layer system layer of the interconnected-cluster photovoltaic matrix array panel;

wherein each solar light fixtures structured enclosure on inside of all surface areas are disposed with a plurality of mirrors including on outer leading edge angled towards inside of solar light structure;

wherein each solar panel structured enclosures are coated with a cooling agent, or a cooling agent disposed with weather proof agent.

4. The multi-layered photovoltaic chambered panel layer system of claim 2, further comprising:

a solar system controller disposed with at least one non-transitory computer-readable medium, at least one program and a plurality of one or more sensors and devices for use by solar panels, solar light fixtures and solar lamp shades;

wherein the plurality of sensors and devices comprise:

a light sensor, humidity sensor, angle of sun sensor, self-monitoring sensor to instruct the movement of at least one screw shank, wind speed sensor, heat sensor, a plurality of mirrors, a temperature sensor, corrosion sensor, a plurality of digital logic circuits, logic sensor, a nano circuitry, a solar tracking mount sensor, a rheostat, vibration sensor, sensor to detect inefficient or efficient solar radiation, solar radiation sensor (SRS) device, logic sensor, a light-booster sensor, a solar light sensor to turn on or off the LED light fixture or fixtures, a user selected time of LED light fixture or fixtures to be on or off;

wherein the multi-layered photovoltaic chambered panel layer system's solar system controller monitors total watt generation stored in a least one computer readable medium;

wherein the solar system controller, battery-charging system controller and the LED light fixtures are disposed of compartmentalized modules with ease of replacements;

wherein the solar system controller performances comprise:

a plurality of performance attributes of devices, sensors, solar-cells or solar-cells modules functional attributes sent to a smart device display;

wherein the multi-layered photovoltaic chambered panel layer system controller further comprises:

a determination of a declining deficiency rate decision of at least one non-transitory computer- readable medium performing a comparison by at least one algorithmic program stored in a computer- readable medium based on a current message reading comparison with prior message readings from one or more solar-cells or solar-cell modules determining a deterioration rate or life expectancy of the one or more solar-cells or solar-cell modules;

wherein performance attributes comprise:

a solar cell, solar-cell module or LED deterioration rate factors;

a life expectancy or a life span of at least one solar cell, a cluster of solar-cells or solar-cells modules;

a termination of communications;

a loose connection;

an inefficient or efficient solar radiation level;

an efficient angle with sun of the multi-layered photovoltaic chambered panel layer system position;

a gating of power distribution to battery charging system, external port, a connected device, LED light fixture, one or more colored LED's and one or more light-booster;

an initiation of a plurality of LED's to display in a field on the solar panel, solar light fixture or a solar lamp shade displaying the solar system attributes;

a generation of solar system performance attributes and diagnostic analytics;

at least one Wi-Fi data link connection;

one or more wireless communication links (com-links);

a communication link with a receiving station;

a communication data link to a smart device built with a display;

a web-based application;

a plurality of sensors;

at least one external charging port;

a connection port to interconnect one or more solar panels and light fixtures;

a battery-charging controller;

a battery charging or discharging rate or rates;

at least one of a plurality of batteries;

at least one screw shank powered by one or more batteries, or powered by at least one quadrant area of the multi-layered photovoltaic chambered panel layer of the interconnected-cluster photovoltaic matrix array panel system;

a plurality of rechargeable batteries disposed within a protective water or dust chamber;

a plurality of LEDs' displaying diagnostic information powered by either a battery-charging controller, or at least one or more of the solar-cells or the solar-cells modules within one or more arrays, or quadrants;

a battery enclosure disposed of a fire retardant chamber;

wherein each battery within the fire retardant chamber retardant chamber is built within a protective battery chamber;

a battery-charging controller transmitting data to the solar system controller;

a solar system controller disposed within a modular protected housing or structure.

5. The multi-layered photovoltaic chambered panel layer system of claim 2, wherein the solar system gates watt power generated to battery-charging system, LED's and at least one charging port and generates diagnostic analytics.

6. The multi-layered photovoltaic chambered panel layer system of claim 2, further comprising:

a Quadrant Surface Identification (QSI), or a coordinate expression of each solar-cell or solar-cell modules location within a quadrant, a section, array or a cluster of arrays;

wherein QSI is identified by binary, alpha numeric, combinations of binary and alpha numeric.

7. The multi-layered photovoltaic chambered panel layer system of claim 2, wherein the system controller determines end-of-life or end-of-life cycle for each of the solar-cells or the solar-cell modules within an array, cluster of quadrants.

8. The multi-layered photovoltaic chambered panel layer system of claim 2, wherein the solar-cells or solar-cell modules are designed disposed of a concavex (CNCVX) configuration.

9. The multi-layered photovoltaic chambered panel layer system of claim 2 wherein additional models of the multi-layered photovoltaic chambered panel layer system of the number of interconnected-cluster photovoltaic matrix array panels for solar light fixtures and solar lamp shades are computer designed and field tested for specific geographical locations.

10. The multi-layered photovoltaic chambered panel layer system of claim 2 wherein diagnostic information data is generated by the solar system controller transmitted wirelessly;

wherein diagnostic information includes data analytics generated by solar system controller including diagnostics from battery-charging system controller;

wherein wireless transmissions are sent by a data link to at least one receiving station or a smart device.

11. The multi-layered photovoltaic chambered panel layer system of claim 2, further comprising at least four quadrants on solar panel systems, solar light fixtures and solar lamp shades;

wherein each of the multi-layered photovoltaic chambered panel system comprises at least two chamber layers, or at least one multi-layered photovoltaic chambered panel system model of the multi-layered photovoltaic chambered panel system are built with multiple chambered layers, comprising:

a primary chamber, a secondary chamber layer and subsequent chambered layers;

wherein the multi-layered photovoltaic chambered panel system comprise at least one configured quadrant;

wherein each quadrant comprises:

at least four sections within the quadrant;

a plurality of the solar-cells and the solar-cell modules disposed within the multi-layered photovoltaic chambered panel layer system within each of the interconnected-cluster photovoltaic matrix array panels, further comprising:

a multi-layered photovoltaic chambered panel layer system with a plurality of the interconnected-cluster photovoltaic matrix array panels disposed on at least one panel area field, or other models solar panels or solar light fixtures of the multi-layered photovoltaic chambered panel layer system disposed of at least four quadrants;

wherein quadrants configurations are designed and said model features, comprising:

at least one cluster of two or more arrays of at least two or more interconnected arrays, or a plurality of independently interconnected-clusters of the solar-cells or the solar-cell modules disposed on the flexible film;

at least two array interconnected within at least one cluster of independent interconnected the solar-cells or the solar-cell modules separately enclosed disposed within a least one array or clusters of arrays disposed on the flexible film;

a quadrant independently or separately enclosed of a plurality of three or more clusters of three or more of the solar-cells or the solar-cell modules disposed within an array, or, one or more sections of a quadrant disposed with three or more arrays within each cluster disposed on the flexible film;

a quadrant comprised of a plurality of interconnected independently or separately enclosed three or more of the solar-cells or the solar-cell modules disposed on flexible film in no particular pattern;

a quadrant of at least two array of a plurality of a least three or more clustered interconnected independently or separately enclosed of the solar-cells or the solar-cell modules disposed on the flexible film;

a quadrant of at least one array of a plurality of interconnected independently or separately enclosed solar-cells, a plurality of clusters of a plurality of interconnected independently enclosed with the solar-cell modules disposed on the flexible film, or a plurality of the solar-cells or the solar-cell modules configured in vertical or horizontal patterns within a quadrant or on the entire panel system;

a quadrant disposed with a plurality of interconnected independently or separately enclosed the solar-cells or the solar-cell modules disposed on flexible film;

a quadrant of a plurality of clusters of at least three or more interconnected independently or separately enclosed solar-cells or solar-cell modules disposed on flexible film;

a quadrant of a plurality of interconnected independently or separately enclosed solar-cells or solar-cell modules disposed on the flexible film;

a quadrant of at least one section of one or more clusters of the interconnected independently or separately enclosed of the solar-cells or the solar-cell modules disposed on flexible film, or a quadrant of at least four sections of at least four arrays comprising at least two or more clusters of at least two or more interconnected independently or separately enclosed solar-cells or solar-cell modules disposed on flexible film;

a plurality of quadrants or sections each disposed with at least two of more clusters of at least three interconnected independently or separately enclosed solar-cells or the solar-cell modules disposed on flexible film; and a plurality of the solar-cells or the solar-cell modules interconnected in a plurality of calculated configured patterns disposed on flexible film.

\* \* \* \* \*